(12) United States Patent
Hatakeyama

(10) Patent No.: US 12,112,807 B2
(45) Date of Patent: Oct. 8, 2024

(54) SEMICONDUCTOR STORAGE DEVICE

(71) Applicant: KIOXIA CORPORATION, Tokyo (JP)

(72) Inventor: Mina Hatakeyama, Hiratsuka Kanagawa (JP)

(73) Assignee: Kioxia Corporation, Tokyo (JP)

( * ) Notice: Subject to any disclaimer, the term of this patent is extended or adjusted under 35 U.S.C. 154(b) by 223 days.

(21) Appl. No.: 17/902,725

(22) Filed: Sep. 2, 2022

(65) Prior Publication Data

US 2023/0307059 A1 Sep. 28, 2023

(30) Foreign Application Priority Data

Mar. 23, 2022 (JP) ................................. 2022-047651

(51) Int. Cl.
*G11C 16/14* (2006.01)
*G11C 16/26* (2006.01)

(52) U.S. Cl.
CPC ............. *G11C 16/14* (2013.01); *G11C 16/26* (2013.01)

(58) Field of Classification Search
CPC ............................... G11C 16/14; G11C 16/26
USPC .................................................... 365/185.01
See application file for complete search history.

(56) References Cited

U.S. PATENT DOCUMENTS

| 7,916,547 | B2 | 3/2011 | Hosono |
| 8,829,646 | B2 * | 9/2014 | Lung .................... H10B 20/20 257/530 |
| 9,299,455 | B2 | 3/2016 | Suzuki et al. |
| 9,318,214 | B2 | 4/2016 | Hosono et al. |

(Continued)

FOREIGN PATENT DOCUMENTS

| JP | 4510060 B2 | 7/2010 |
| JP | 5781109 B2 | 9/2015 |

OTHER PUBLICATIONS

S. Lee., et al, "A 128Gb 2b/cell NAND Flash Memory in 14nm Technology with tprog=640μs and 800MB/s I/O Rate" Samsung Electronics, Hwaseong, Korea, Digest of Technical Papers, ISSCC 2016, Section 7, Nonvolatile Memory Solutions/7.5, 2016 IEEE International Solid-State Circuits Conferences, Feb. 2, 2016, pp. 138-139.

(Continued)

*Primary Examiner* — Huan Hoang
(74) *Attorney, Agent, or Firm* — Kim & Stewart LLP

(57) ABSTRACT

A semiconductor storage device includes a circuit, a first plurality of conductive layers arranged along a first direction, extending along a second direction, and including first through third layers, the first layer between the second and third layers, a second plurality of conductive layers including fourth through sixth layers corresponding to the first through third layers and separated therefrom, a semiconductor layer extending between the first and second pluralities, and a charge storage layer between the semiconductor layer and the first and second pluralities. The circuit applies, in a verification operation of a write operation on the first conductive layer, a verification voltage to the first layer, a voltage smaller than the verification voltage to the fourth layer, a read voltage larger than the verification voltage to the second and fifth conductive layers, and a second voltage smaller than the read voltage to the third or sixth conductive layer.

20 Claims, 16 Drawing Sheets

(56) References Cited

U.S. PATENT DOCUMENTS 11,792,988 B2 * 10/2023 Ogawa .................. H10B 43/50
365/185.17

OTHER PUBLICATIONS

D. Kang, et al., "256Gb 3b/Cell V-NAND Flash Memory with 48 Stacked WL Layers" Digest of Technical Papers, ISSCC 2016 / Session 7 / Nonvolatile Memory Solutions / 7.1, 2016 IEEE International Solid-State Circuits Conference, Feb. 2, 2016, pp. 130-131.

H. Noguchi et al., "4Mb STT-MRAM-Based Cache with Memory-Access-Aware Power Optimization and Write-Verify-Write / Read-Modify-Write Scheme" Digest of Technical Papers, ISSCC 2016/ Ession 7/Nonvolatile Memory Solutions/7.2, 2016 IEEE International Solid-State Circuits Conference (ISSCC), San Francisco, CA, USA, Feb. 2, 2016, pp. 132-133.

Win-San Khwa et al., "A Resistance-Drift Compensation Scheme to Reduce MLC PCM Raw BER by Over 100×for Storage-Class Memory Applications" Digest of Technical Papers, ISSCC 2016/ Session 7/Nonvolatile Memory Solutions /7.3, 2016 IEEE International Solid-State Circuits Conference (ISSCC), San Francisco, CA, USA, Feb. 2, 2016, pp. 134-135.

Chien-Chen Lin et al., "A 256b-Wordlength ReRAM-based TCAM with 1ns Search-Time and 14×Improvement in WordLength-EnergyEfficiency-Density Product using 2.5T1R cell" Digest of Technical Papers, ISSCC 2016/Session 7/Nonvolatile Memory Solutions /7.4, 2016 IEEE International Solid-State Circuits Conference (ISSCC), San Francisco, CA, USA, Feb. 2, 2016, pp. 136-137.

H. Mitani et al., "A 90nm Embedded 1T-Monos Flash Macro for Automotive Applications with 0.07mJ/8kB Rewrite Energy and Endurance Over 100M Cycles Under Tj of 175°C" Digest of Technical Papers, ISSCC 2016/Session 7/ Nonvolatile Memory Solutions /7.6, 2016 IEEE International Solid-State Circuits Conference (ISSCC), San Francisco, CA, USA, Feb. 2, 2016, pp. 140-141.

T. Tanaka et al., "A 768Gb 3b/cell 3D-Floating-Gate NAND Flash Memory" Digest of Technical Papers, ISSCC 2016/ Session 7/Nonvolatile Memory Solutions /7.7, 2016 IEEE International Solid-State Circuits Conference (ISSCC), San Francisco, CA, USA, Feb. 2, 2016, pp. 142-143.

Sungdae Choi, et al., "Session 7 Overview: Nonvolatile Memory Solutions" Digest of Technical Papers, ISSCC 2016/ Session 7/Nonvolatile Memory Solutions/Overview, 2016 IEEE International Solid-State Circuits Conference (ISSCC), San Francisco, CA, USA, Feb. 2, 2016, pp. 128-129.

* cited by examiner

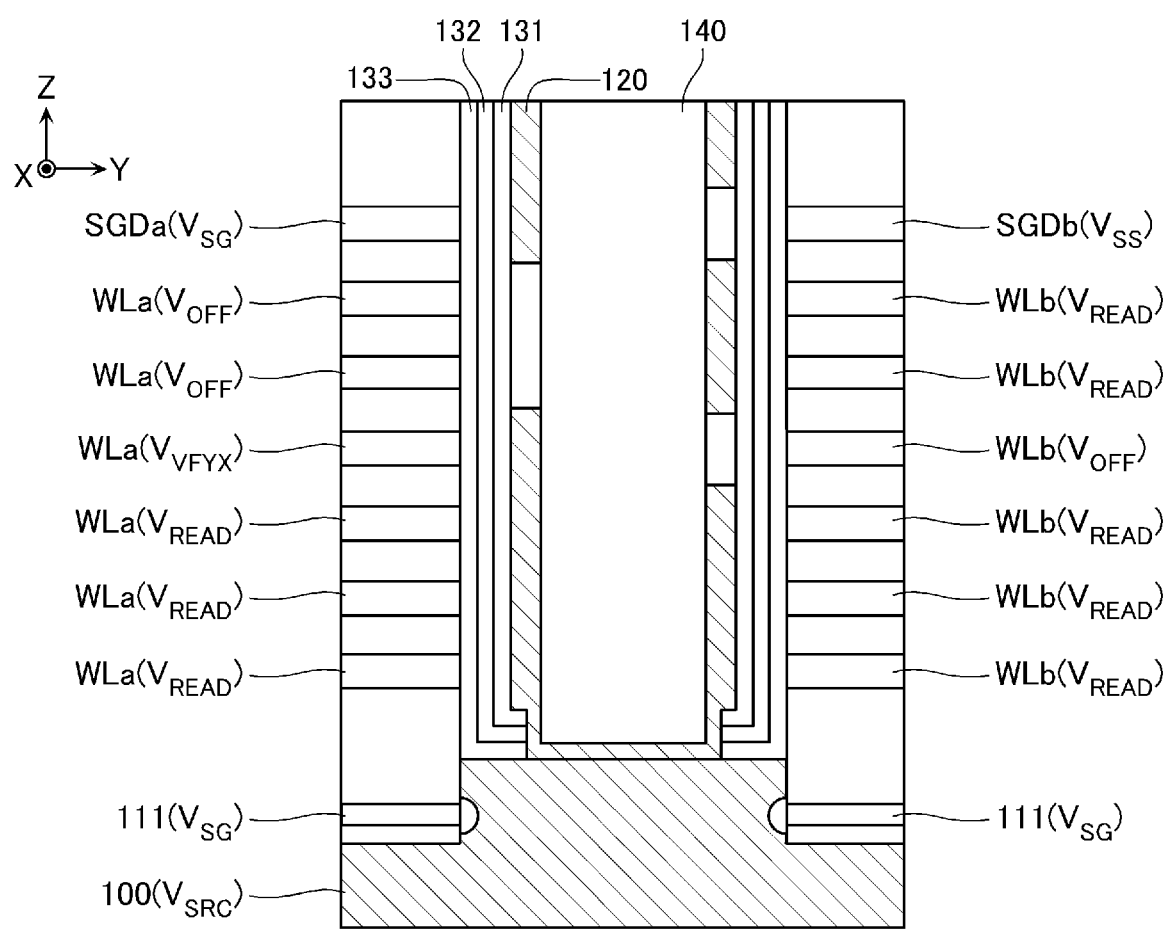

SEMICONDUCTOR STORAGE DEVICE

CROSS-REFERENCE TO RELATED APPLICATION(S)

This application is based upon and claims the benefit of priority from Japanese Patent Application No. 2022-047651, filed Mar. 23, 2022, the entire contents of which are incorporated herein by reference.

FIELD

Embodiments described herein relate generally to a semiconductor storage device and a method performed by a semiconductor storage device.

BACKGROUND

There is a semiconductor storage device including a substrate, a plurality of gate electrodes stacked in a direction crossing the surface of the substrate, a semiconductor layer facing the plurality of gate electrodes, and a gate insulation layer provided between the gate electrodes and the semiconductor layer. The gate insulation layer includes a memory section capable of storing data, for example, an insulating charge storage layer such as silicon nitride ($Si_3N_4$) or a conductive charge storage layer such as a floating gate.

BRIEF DESCRIPTION OF THE DRAWINGS

FIG. 17 is a schematic cross-sectional view of a semiconductor storage device for illustrating a verification operation according to a sixth embodiment.

DETAILED DESCRIPTION

Figure 1:
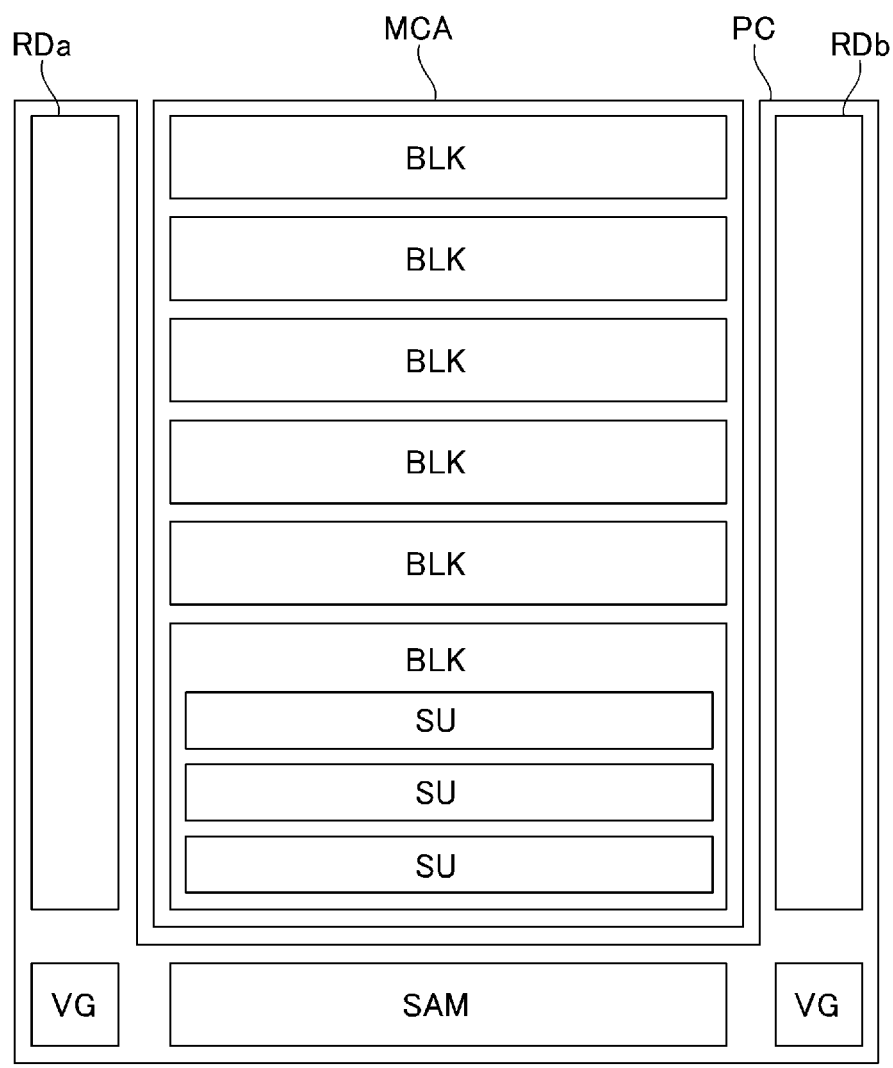
FIG. 1 is a schematic block diagram of a semiconductor storage device according to a first embodiment.

Embodiments provide a semiconductor storage device that operates appropriately.

In general, according to one embodiment, a semiconductor storage device includes a voltage generation circuit, a first plurality of conductive layers arranged along a first direction, extending along a second direction crossing the first direction, and including first, second, and third conductive layers, the first conductive layer being between the second and third conductive layers, a second plurality of conductive layers arranged along the first direction, extending along the second direction, including fourth, fifth, and sixth conductive layers at positions corresponding to the first through third conductive layers and separated therefrom in the second direction, a first semiconductor layer extending along the first direction between the first and second pluralities, and a charge storage layer extending along the first direction and including a first portion between the first semiconductor layer and the first plurality and a second portion between the first semiconductor layer and the second plurality. The voltage generation circuit is configured to, in a first verification operation of a first write operation in which a program voltage has been applied to the first conductive layer, apply a verification voltage to the first conductive layer, a first voltage smaller than the verification voltage to the fourth conductive layer, a read path voltage larger than the verification voltage to the second and fifth conductive layers, and a second voltage smaller than the read path voltage to the third conductive layer or the sixth conductive layer.

Next, a semiconductor storage device according to an embodiment is described in detail with reference to drawings. The following embodiments are mere examples and are not indicated with the intention of limiting the present disclosure. The following drawings are schematic, and some configurations may be omitted for the sake of description. In some cases, common parts of a plurality of embodiments are marked with the same symbol and a description thereof will be omitted.

The term "semiconductor storage device" in the present specification may mean a memory die, or a memory system including a controller die such as a memory chip, a memory card, or a solid-state drive (SSD). That term may mean a computing system including a host computer such as a smartphone, a tablet terminal, a personal computer, and the like.

In the present specification, when a first element is "electrically connected" to a second element, the first element may be directly connected to the second element, or the first element may be connected to the second element via a wiring, semiconductor members or transistors. For example, when three transistors are connected in series, even if a second transistor is in an OFF state, a first transistor is "electrically connected" to a third transistor.

In the present specification, when a first element is "connected between" a second element and a third element, it may mean that the first through third elements are connected in series, and the second element is connected to the third element via the first element.

In the present specification, when a circuit or the like "conducts" two wirings or the like, for example, it may mean that the circuit or the like may include transistors or the like, the transistors or the like is provided in a current path between two wirings, and the transistors or the like enters an ON state.

In the present specification, a direction parallel to the upper surface of a substrate is referred to as an X direction, a direction parallel to the upper surface of the substrate and perpendicular to the X direction is referred to as a Y direction, and a direction perpendicular to the upper surface of the substrate is referred to as a Z direction.

In the present specification, in some cases, a direction along a predetermined surface is referred to as a first direction, a direction crossing the first direction along the predetermined surface is referred to as a second direction, and a direction crossing the predetermined surface is referred to as a third direction. These first, second, and third directions may or may not correspond to X, Y and Z directions.

In the present specification, expressions such as "top" and "bottom" are based on the position of the substrate. For example, the direction going away from the substrate along the Z direction is referred to as upward, and the direction approaching the substrate along the Z direction is referred to as downward. When referring to the lower surface or lower end of a certain element, it means the surface or end part on the substrate side of that element, and when referring to the upper surface or upper end, it means the surface or end part opposite to the substrate of that element. A surface crossing the X direction or the Y direction is referred to as a side surface or the like.

First Embodiment

Configuration

Figure 2:
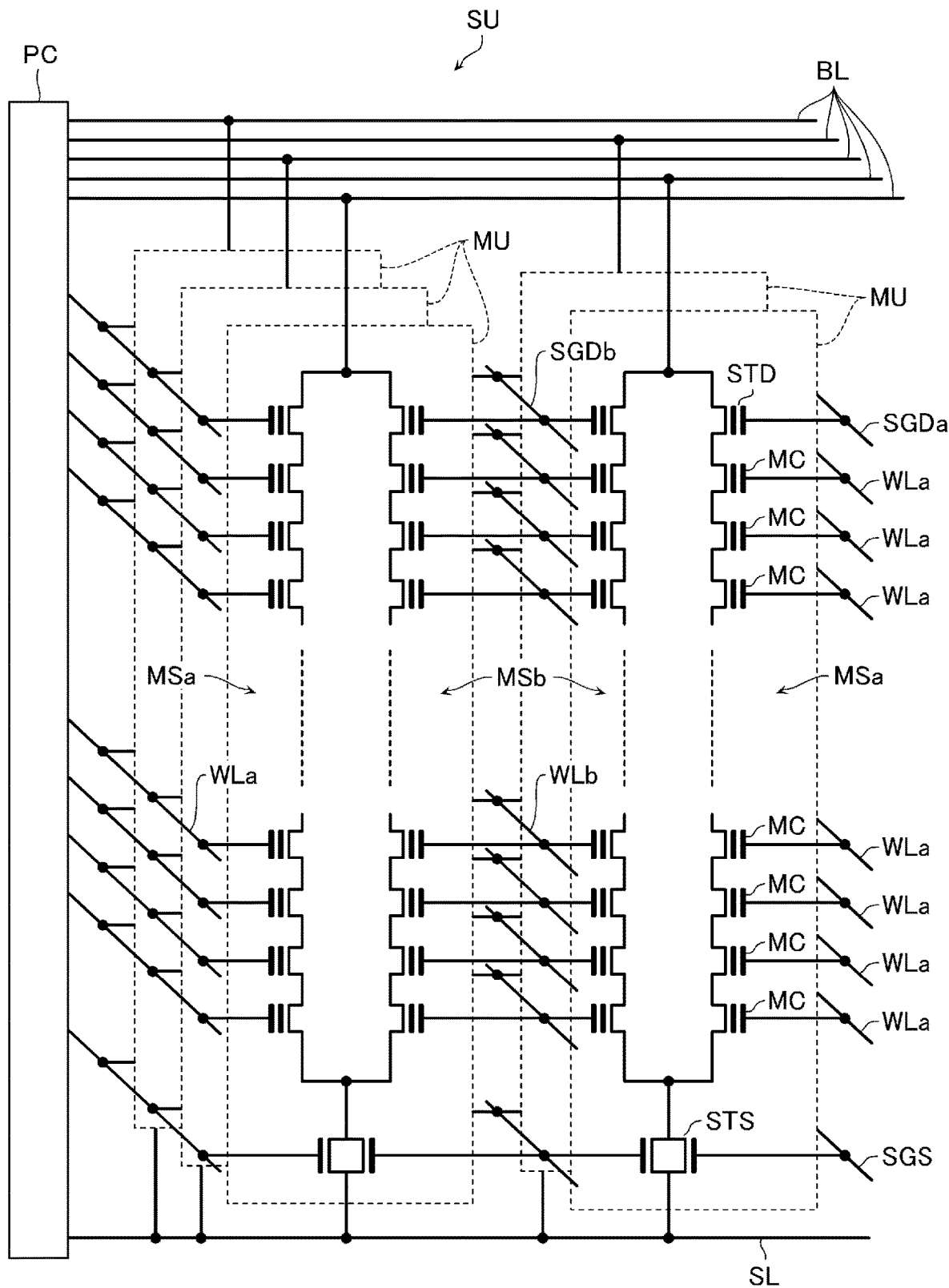
FIGS. 2 and 3 are schematic equivalent circuit diagrams of a semiconductor storage device.
Figure 3:
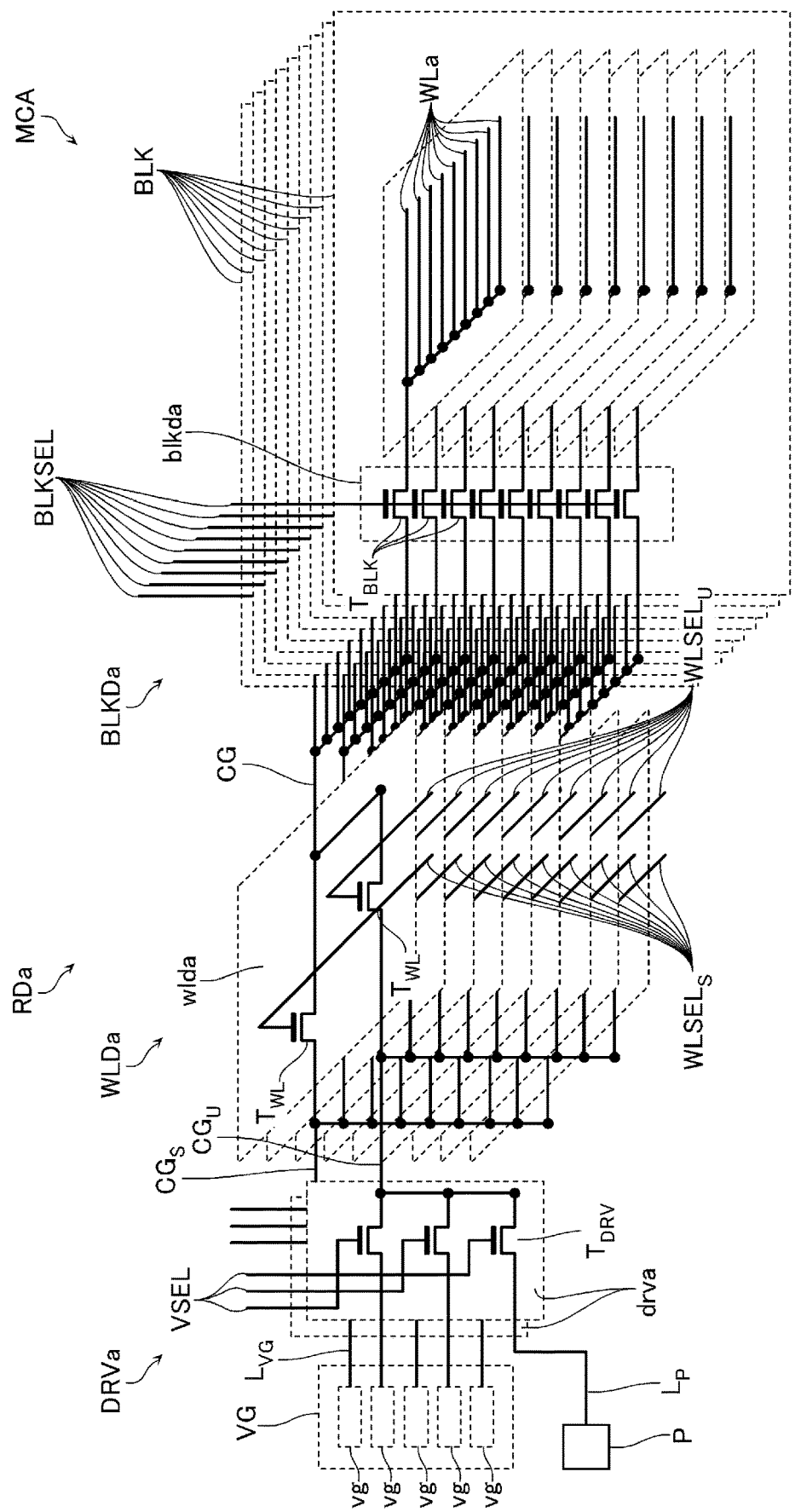

FIG. 1 is a schematic block diagram of a semiconductor storage device according to a first embodiment. FIGS. 2 and 3 are schematic equivalent circuit diagrams of a part of the semiconductor storage device.

As shown in FIG. 1, the semiconductor storage device according to the first embodiment includes a memory cell array MCA and a peripheral circuit PC for controlling the memory cell array MCA.

The memory cell array MCA includes a plurality of memory blocks BLK. Each of the memory blocks BLK includes a plurality of string units SU. Each of the string units SU includes a plurality of memory units MU, for example, as shown in FIG. 2. Each of the memory units MU includes two electrically independent memory strings MSa and MSb. Each end of the memory strings MSa and MSb is connected to a drain-side select transistor STD and is connected to a common bit line BL through the same. Another end of the memory strings MSa and MSb is connected to a common source-side select transistor STS and is connected to a common source line SL through the same.

Each of the memory strings MSa and MSb includes a plurality of memory cells MC connected in series. Each of the memory cells MC is a field effect type transistor including a semiconductor layer, a gate insulation layer, and a gate electrode. The semiconductor layer functions as a channel region. The gate insulation layer includes a charge storage layer capable of storing data. A threshold voltage of the memory cell MC varies according to the amount of charge in the charge storage layer. The gate electrodes of the memory cells MC corresponding to the memory string MSa are connected to word lines WLa. The gate electrodes of the memory cells MC corresponding to the memory string MSb are connected to word lines WLb. The word lines WLa and WLb are connected to all memory units MU in the memory block BLK.

Each of the select transistors (STD and STS) is a field effect type transistor including a semiconductor layer, a gate insulation layer, and a gate electrode. The semiconductor layer functions as a channel region. The gate electrode of the drain-side select transistor STD corresponding to the memory string MSa is connected to a drain-side select gate line SGDa. The gate electrode of the drain-side select transistor STD corresponding to the memory string MSb is connected to a drain-side select gate line SGDb. The drain-side select gate lines SGDa and SGDb are connected to all memory units MU in the string unit SU. The gate electrode of the source-side select transistor STS is connected to a source-side select gate line SGS. The source-side select gate line SGS is connected to all memory units MU in the memory block BLK.

For example, as shown in FIG. 1, the peripheral circuit PC includes row decoders RDa and RDb connected to the memory cell array MCA, a sense amplifier module SAM connected to the memory cell array MCA, and a voltage generating circuit VG connected to the row decoders RDa and RDb and the sense amplifier module SAM. The peripheral circuit PC includes a sequencer, an address register, a status register, and the like, which are not separately depicted in the drawing.

The row decoder RDa includes, for example, a block decoder BLKDa, a word line decoder WLDa, and a driver circuit DRVa as illustrated in FIG. 3.

The block decoder BLKDa includes a plurality of block decoding units blkda provided corresponding to the memory blocks BLK in the memory cell array MCA. Each of the block decoding units blkda includes a plurality of transistors $T_{BLK}$ provided corresponding to a plurality of groups of word lines WLa in the memory block BLK. Each of the transistors $T_{BLK}$ is, for example, a field effect type NMOS transistor. The drain electrode of each transistor $T_{BLK}$ is connected to a group of word lines WLa. The source electrode of the transistor $T_{BLK}$ is connected to a wiring CG. The wiring CG is connected to all block decoding units blkda in the block decoder BLKDa. The gate electrode of each transistor $T_{BLK}$ in a block decoding unit blkda is connected to a signal supply line BLKSEL. A plurality of signal supply lines BLKSEL are provided corresponding to the block decoding units blkda. That is, one of the signal supply lines BLKSEL is connected to all transistors $T_{BLK}$ in a block decoding unit blkda.

In a read operation and a write operation, for example, one signal supply line BLKSEL corresponding to a block address in the address register enters an "H" state, and the other signal supply lines BLKSEL enters an "L" state. For example, a predetermined driving voltage having a positive magnitude is applied to one signal supply line BLKSEL, and a ground voltage $V_{SS}$ or the like is applied to other signal supply lines BLKSEL. Consequently, all word lines WLa in one memory block BLK corresponding to the block address and all wirings CG become conductive. All word lines WLa in the other memory blocks BLK enter a floating state.

The word line decoder WLDa includes a plurality of word line decoding units wlda provided corresponding to the memory cells MC in a memory string MSa. In the example shown in the drawing, the word line decoding unit wlda includes two transistors $T_{WL}$. Each of the transistors $T_{WL}$ is, for example, a field effect type NMOS transistor. The drain electrode of each transistor $T_{WL}$ is connected to a wiring CG. The source electrode of the transistor $T_{WL}$ is connected to a wiring $CG_S$ or a wiring $CG_U$. The gate electrode of the transistor $T_{WL}$ is connected to a signal supply line $WLSEL_S$ or a signal supply line $WLSEL_U$. A plurality of signal supply lines $WLSEL_S$ are each connected to one of the transistors $T_{WL}$ provided in a word line decoding unit wlda. A plurality of signal supply lines $WLSEL_U$ are each connected to the other transistor $T_{WL}$ provided in the word line decoding unit wlda.

In a read operation and a write operation, for example, the signal supply line $WLSEL_S$ corresponding to one word line decoding unit wlda corresponding to a page address in the address register enters an "H" state, and the corresponding signal supply line $WLSEL_U$ enters an "L" state. The signal supply lines $WLSEL_S$ corresponding to the other word line decoding units wlda enter "L" state, and the corresponding signal supply line $WLSEL_U$ enters "H" state. The voltage corresponding to the selected word line WLa is applied to the wiring $CG_S$. The voltage corresponding to the non-selected word line WLa is applied to the wiring $CG_U$. Consequently, the voltage corresponding to the selected word line WLa is applied to one word line WLa corresponding to the page address. The voltage corresponding to the non-selected word line WLa is applied to the other word lines WLa. When the page address in the address register corresponds to the word line WLb instead of the word line WLa, the voltage corresponding to the non-selected word line WLa may be applied to all word lines WLa.

The driver circuit DRVa includes, for example, two driver units drva provided corresponding to the wiring $CG_S$ and the wiring $CG_U$. Each of the driver units drva includes a plurality of transistors $T_{DRV}$. Each of the transistors $T_{DRV}$ is, for example, a field effect type NMOS transistor. The drain electrode of each transistor $T_{DRV}$ is connected to the wiring $CG_S$ or the wiring $CG_U$. The source electrode of the transistor $T_{DRV}$ is connected to a voltage line $LV_G$ or a voltage line $L_p$. The voltage line $LV_G$ is connected to one of a plurality of output terminals of the voltage generating circuit VG. The voltage line $L_p$ is connected to a bonding pad electrode P to which the ground voltage $V_{SS}$ is applied. The gate electrode of the transistor $T_{DRV}$ is connected to a signal supply line VSEL.

In a read operation and a write operation, for example, any of a plurality of signal supply lines VSEL corresponding to one driver unit drva enters an "H" state and the other signal supply lines VSEL enter an "L" state.

The row decoder RDb is configured almost in the same way as the row decoder RDa. It is noted that the transistors $T_{BLK}$, $T_{WL}$, and $T_{DRV}$, wirings CG, $CG_S$, and $CG_U$, and the like in a row decoder RDb are electrically connected to word lines WLb, rather than word lines WLa.

The voltage generating circuit VG includes a plurality of voltage generating units vg, for example, as shown in FIG. 3. The voltage generating unit vg generates voltage of predetermined voltage values in a read operation, a write operation, and the like, and applies the voltages to the voltage line $L_{VG}$. For example, the voltage generating unit vg may be a step-up circuit such as a charge pump circuit or a step-down circuit such as a regulator.

The sense amplifier module SAM (FIG. 1) includes a plurality of sense amplifier units provided corresponding to a plurality of bit lines BL (FIG. 2). The sense amplifier unit includes a sense transistor having a gate electrode electrically connected to a corresponding bit line BL, a plurality of data latch circuits connected to the drain electrodes of the sense transistors, and a voltage adjusting circuit that adjusts the voltage of the bit line BL according to one data of the data latch circuits.

Figure 4:
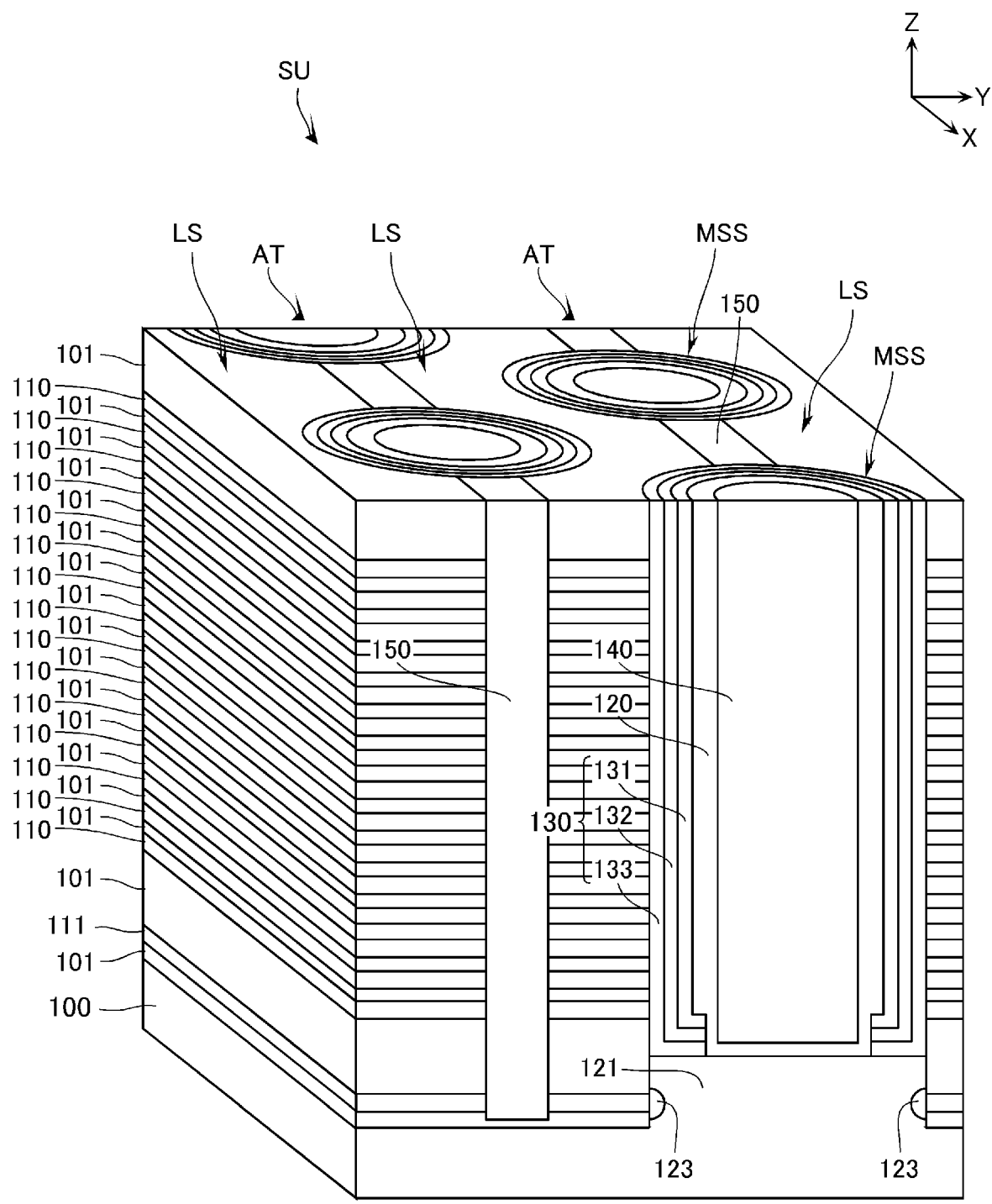
FIG. 4 is a schematic perspective view of a semiconductor storage device.
Figure 5:
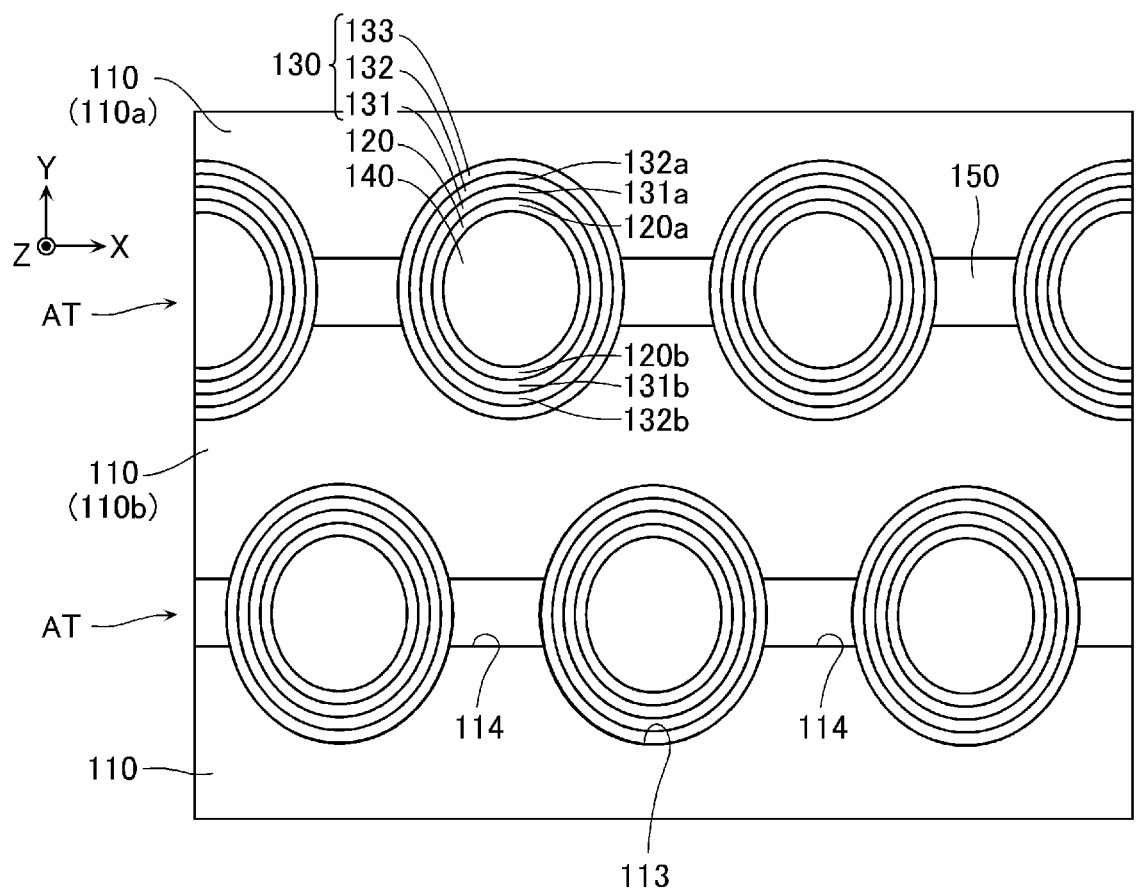
FIG. 5 is a schematic plan view of a semiconductor storage device.

Next, an example of the configuration of the semiconductor storage device according to this embodiment is described with reference to FIGS. 4 and 5. FIGS. 4 and 5 are schematic perspective views showing a part of the semiconductor storage device according to the present embodiment.

As shown in FIG. 4, the semiconductor storage device according to the present embodiment includes a semiconductor substrate 100. The semiconductor substrate 100 is, for example, a semiconductor substrate such as a single crystal silicon (Si) containing p-type impurities. An n-type well containing n-type impurities and a p-type well containing p-type impurities are provided along the upper surface of the semiconductor substrate. For example, transistors, wiring, and the like constituting at least a part of the peripheral circuit PC (FIG. 1) are provided along the surface of the semiconductor substrate 100.

The string unit SU is provided above the semiconductor substrate 100.

For example, as shown in FIG. 4, the string unit SU includes a plurality of stacked body structures LS located in the Y direction and a trench structure AT provided between the stacked body structures LS. The stacked body structure LS includes a plurality of conductive layers 110 stacked in the Z direction. The trench structure AT includes a plurality of memory string structures MSS located in the X direction. Each memory string structure MSS includes a substantially bottomed cylindrical semiconductor layer 120 extending in the Z direction, a gate insulation layer 130 provided between the stacked body structure LS and the semiconductor layer 120, and an insulating layer 140 such as silicon oxide ($SiO_2$) provided at the central part of the semiconductor layer 120. An insulating layer 150 such as silicon oxide ($SiO_2$) is provided between the memory string structures MSS located in the X direction.

Each of the conductive layers 110 is a substantially plate-shaped conductive layer extending in the X direction, for example, a stacked film of titanium nitride (TiN) and tungsten (W), or a conductive layer such as polycrystalline silicon (Si) in which impurities are injected. A part of the conductive layers 110 function as a word line WLa or a word line WLb and the gate electrode of a memory cell MC (FIG. 2). A part of the conductive layers 110 positioned above this region functions as the drain-side select gate line SGDa or the drain-side select gate line SGDb and the gate electrode of the drain-side select transistor STD (FIG. 2).

The conductive layer 111 containing a material similar to, for example, the conductive layer 110 is provided below the conductive layers 110. The conductive layer 111 functions as the source-side select gate line SGS and the gate electrode of the source-side select transistor STS (FIG. 2).

An insulating layer 101 such as silicon oxide ($SiO_2$) is provided between the conductive layers 110, between the lowest conductive layer 110 and the conductive layer 111, and between the conductive layer 111 and the semiconductor substrate 100.

In the example shown in FIG. 5, a surface 113 of the conductive layer 110 in contact with the gate insulation layer 130 is formed in a curved shape along the outer periphery of a substantially circular region (for example, a circular, elliptical, oblong, or other shapes of region) centered on the central axis of the insulating layer 140. A surface 114 of the conductive layer 110 in contact with the insulating layer 150 is formed in a straight line extending in the X direction.

The conductive layers 110 provided in even or odd-numbered stacked body structures LS from one Y direction side among the stacked body structures LS located along the Y direction are sometimes referred to as the conductive layers 110a. The conductive layers 110 provided in the other stacked body structures LS are sometimes referred to as the conductive layers 110b.

The conductive layers 110a function as the gate electrodes and the word lines WLa of the memory cells MC provided in a memory string MSa or the gate electrode and the drain-side select gate line SGDa of the drain-side select transistor STD provided in the memory string MSa.

The conductive layers 110b function as the gate electrodes and the word lines WLb of the memory cells MC provided in a memory string MSb, or the gate electrode and the drain-side select gate line SGDb of the drain-side select transistor STD provided in the memory string MSb.

The semiconductor layer 120 includes, for example, undoped polycrystalline silicon (Si). As mentioned above, the semiconductor layer 120 has a substantially bottomed cylindrical shape. In the following description, one region of the semiconductor layer 120 close to a plurality of conductive layers 110a is sometimes referred to as a region 120a (FIG. 5), and another region close to a plurality of conductive layers 110b is sometimes referred to as a region 120b (FIG. 5). The region 120a functions as a channel region of each of the memory cells MC and the drain-side select transistor STD provided in the memory string MSa (FIG. 2). The region 120b functions as a channel region of each of the memory cells MC and the drain-side select transistor STD provided in the memory string MSb (FIG. 2).

A semiconductor layer 121 (FIG. 4) is connected to the lower end of the semiconductor layer 120. The semiconductor layer 121 faces two adjacent conductive layers 111 in the Y direction. The semiconductor layer 121 includes single crystal silicon (Si) and functions as a channel region of the source-side select transistor STS (FIG. 2). An insulating layer 123 such as silicon oxide ($SiO_2$) is provided between the semiconductor layer 121 and the conductive layer 111.

In the example shown in FIG. 4, the semiconductor substrate 100 functions as part of the source line SL (FIG. 2), and the semiconductor layer 120 is electrically connected to the peripheral circuit PC via the semiconductor layer 121 and the semiconductor substrate 100. However, such a configuration is a mere example and may be adjusted appropriately. For example, the semiconductor layer 121 may be omitted, wiring or the like functioning as a part of the source line SL (FIG. 2) may be provided below or above the memory block BLK, and the semiconductor layer 120 and the peripheral circuit PC may be electrically connected via the wiring or the like.

The gate insulation layer 130 has a substantially cylindrical shape and extends in the Z direction along the outer peripheral surface of the semiconductor layer 120. The gate insulation layer 130 includes a tunnel insulation layer 131 such as silicon oxide ($SiO_2$), a charge storage layer 132 such as silicon nitride (SiN), and a block insulation layer 133 such as silicon oxide ($SiO_2$) which are provided from the semiconductor layer 120 side to the conductive layer 110 side.

In the following description, in the charge storage layer 132, a region provided between a conductive layer 110a and a region 120a of the semiconductor layer 120 is sometimes referred to as a region 132a (FIG. 5), and a region provided between a conductive layer 110b and a region 120b of the semiconductor layer 120 is sometimes referred to as a region 132b (FIG. 5). Similarly, in the following description, in the tunnel insulation layer 131, a region between the region 120a and the region 132a is referred to as a region 131a (FIG. 5), and a region between the region 120b and the region 132b is referred to as a second region 131b (FIG. 5).

Threshold Voltage of Memory Cell MC

Next, a threshold voltage of a memory cell MC is described with reference to FIG. 6.

As mentioned above, the memory cell array MCA includes a plurality of memory cells MC. When a write operation is executed on the memory cells MC, the threshold voltage of the memory cells MC is controlled to a plurality of states.

Figure 6:
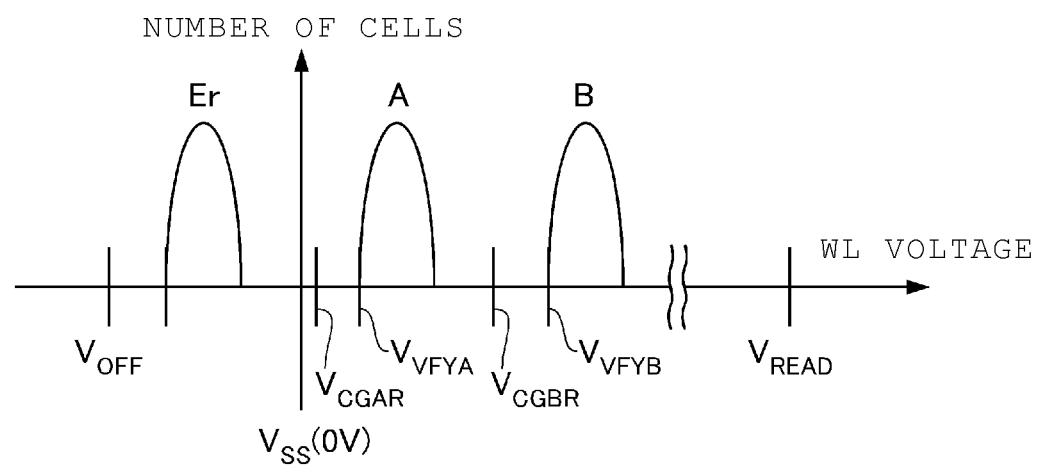
FIG. 6 is a schematic histogram of a threshold voltage of a memory cell in which a plurality of bits of data are recorded.

FIG. 6 is a schematic histogram illustrating the threshold voltage of the memory cell MC in which a plurality of bits of data are recorded. The horizontal axis indicates the voltages of the word lines WLa and WLb, and the vertical axis indicates the number of memory cells MC.

FIG. 6 shows three distributions of the threshold voltage of the memory cell MC. For example, the threshold voltage of the memory cell MC controlled to Er state is larger than a read cutoff voltage $V_{OFF}$ and smaller than a read voltage $V_{CGAR}$. The threshold voltage of the memory cell MC controlled to A state is larger than the read voltage $V_{CGAR}$ and smaller than a read voltage $V_{CGBR}$. The minimum threshold voltage in the threshold voltage distribution of A state is about the size of a verification voltage $V_{VFYA}$. The threshold voltage of the memory cell MC controlled to B state is larger than the read voltage $V_{CGBR}$. The minimum threshold voltage in the threshold voltage distribution of B state is about the size of the verification voltage $V_{VFYB}$. The threshold voltages of all memory cells MC are smaller than a read path voltage $V_{READ}$.

One bit or a plurality of bits of data are assigned to each of these threshold voltage distributions.

For example, when three bits of data are stored in a memory cell MC, the threshold voltage of the memory cell MC is controlled to be any one of $2^3=8$ threshold voltage distributions. Data "0, 0, 0", "0, 0, 1", "0, 1, 0", "0, 1, 1", "1, 0, 0", "1, 0, 1", "1, 1, 0", and "1, 1, 1" are assigned to these eight threshold voltage distributions.

For example, when one bit of data is stored in a memory cell MC, the threshold voltage of the memory cell MC is controlled to be any one of $2^1=2$ threshold voltage distributions. Data "0" and "1" are assigned to these two threshold voltage distributions.

Figure 7:
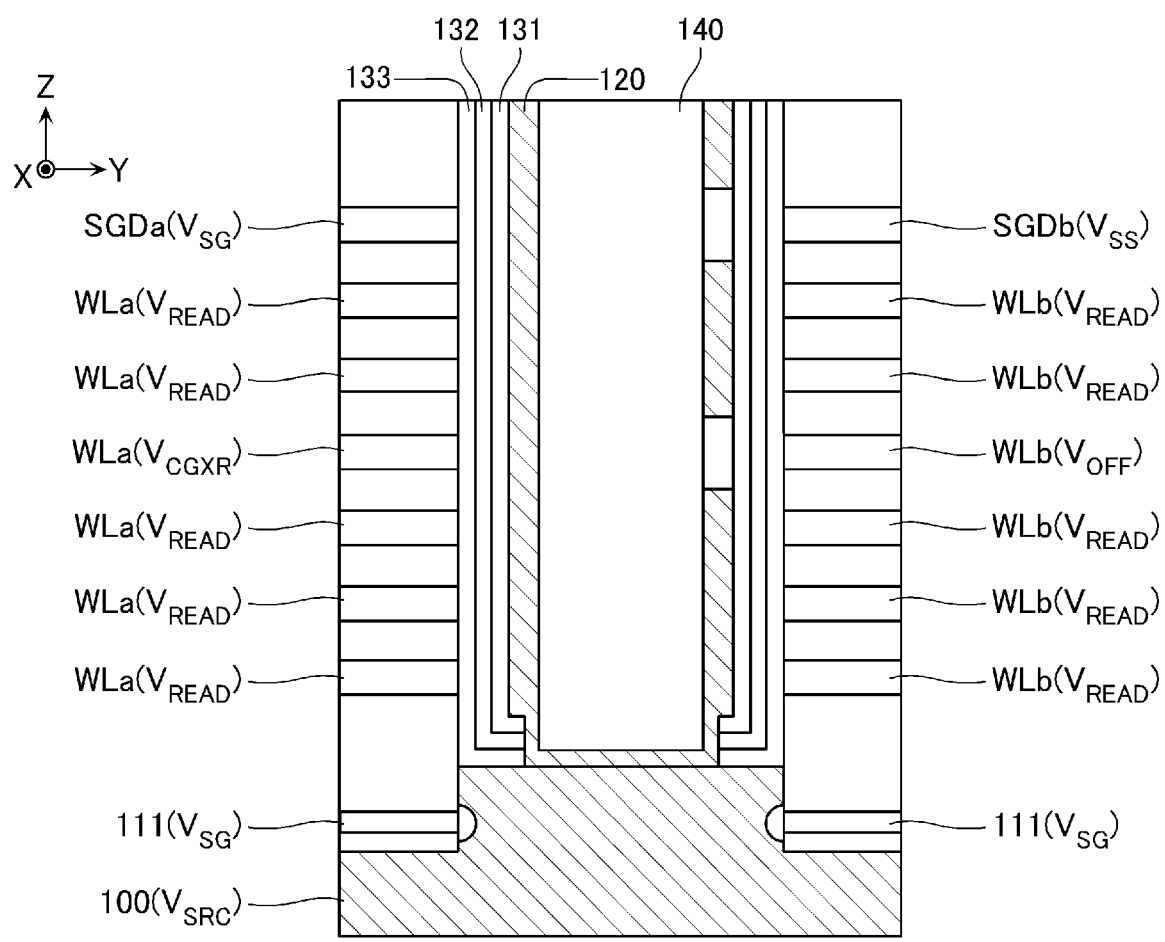
FIG. 7 is a schematic cross-sectional view of a semiconductor storage device for illustrating a read operation according to a first embodiment.

Read Operation Next, a read operation of the semiconductor storage device according to this embodiment is described with reference to FIG. 7. FIG. 7 is a schematic cross-sectional view of the semiconductor storage device for illustrating the read operation. Read operations according to the embodiment are executed collectively on all memory cells MC provided in a designated string unit SU in a designated memory block BLK and connected to a designated word line WLa or word line WLb. A group of such a plurality of memory cells MC is sometimes referred to as a page section. FIG. 7 illustrates an example of executing a read operation on a page section corresponding to a memory string MSa.

In the following description, a non-selected word line WLa positioned on the bit line BL side rather than the selected word line WLa is sometimes referred to as a front surface drain-side word line WLa. A non-selected word line WLa positioned on the source line SL side rather than the selected word line WLa is sometimes referred to as a front surface source-side word lines WLa.

In the following description, a word line WLb adjacent to the selected word line WLa in the Y direction is sometimes referred to as an adjacent word line WLb. A non-selected word line WLb positioned on the bit line BL side rather than the adjacent word line WLb is sometimes referred to as a rear surface drain-side word line WLb. A non-selected word line WLb positioned on the source line SL side rather than the adjacent word line WLb is sometimes referred to as a rear surface source-side word line WLb.

As shown in FIG. 7, in a read operation, a read voltage $V_{CGXR}$ (read voltage $V_{CGAR}$, $V_{CGBR}$ or other read voltage in FIG. 6) is applied to the selected word line WLa, a read path voltage $V_{READ}$ is applied to the non-selected word line WLa, and a voltage $V_{SG}$ is applied to the drain-side select gate line SGDa. The read cutoff voltage $V_{OFF}$ is applied to the adjacent word line WLb, the read path voltage $V_{READ}$ is applied to the other non-selected word lines WLb, and the ground voltage $V_{SS}$ is applied to the drain-side select gate line SGDb. The voltage $V_{SG}$ is applied to the source-side select gate line SGS, and a source voltage $V_{SRC}$ is applied to the semiconductor substrate 100.

The voltage $V_{SG}$ is such a voltage that the drain-side select transistor STD and the source-side select transistor STS are turned on, and is larger than the ground voltage $V_{SS}$. The source voltage $V_{SRC}$ is a voltage of the same magnitude as the ground voltage $V_{SS}$ but can be larger than the ground voltage $V_{SS}$.

Consequently, an electron channel for connecting the bit line BL and the channel region of a selected memory cell MC, and an electron channel for connecting the source line SL and the channel region of the selected memory cell MC are formed in the semiconductor layer 120. The selected memory cell MC enters ON state or OFF state according to the amount of charge accumulated in the charge storage layer 132 of the selected memory cell MC. The peripheral circuit PC (FIG. 1) determines data recorded in the memory cell MC by detecting, for example, a voltage applied to the bit line BL or the magnitude of a current flowing in the bit line BL.

Write Operation

Figure 8:
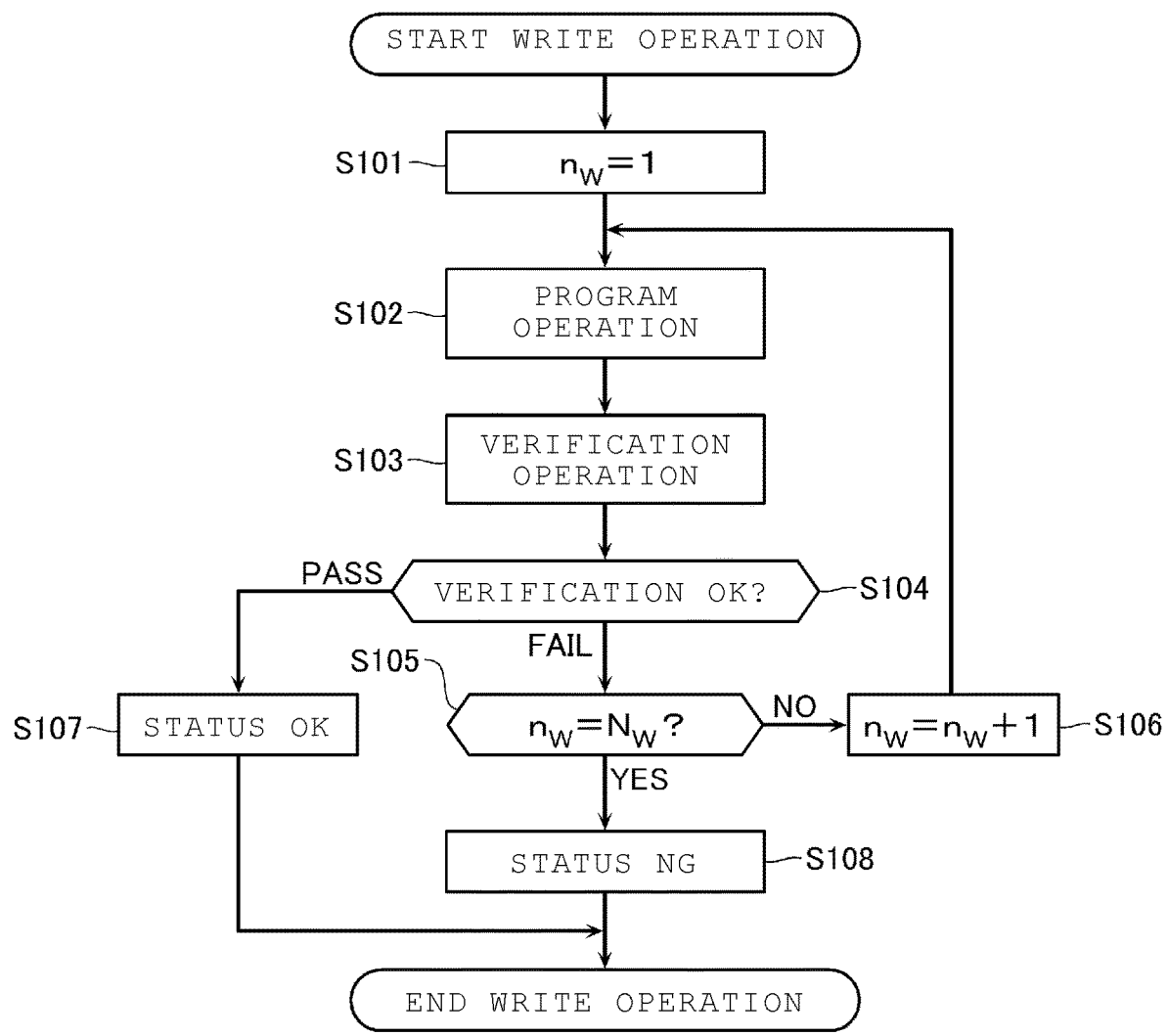
FIG. 8 is a flowchart of a write operation according to a first embodiment.
Figure 9:
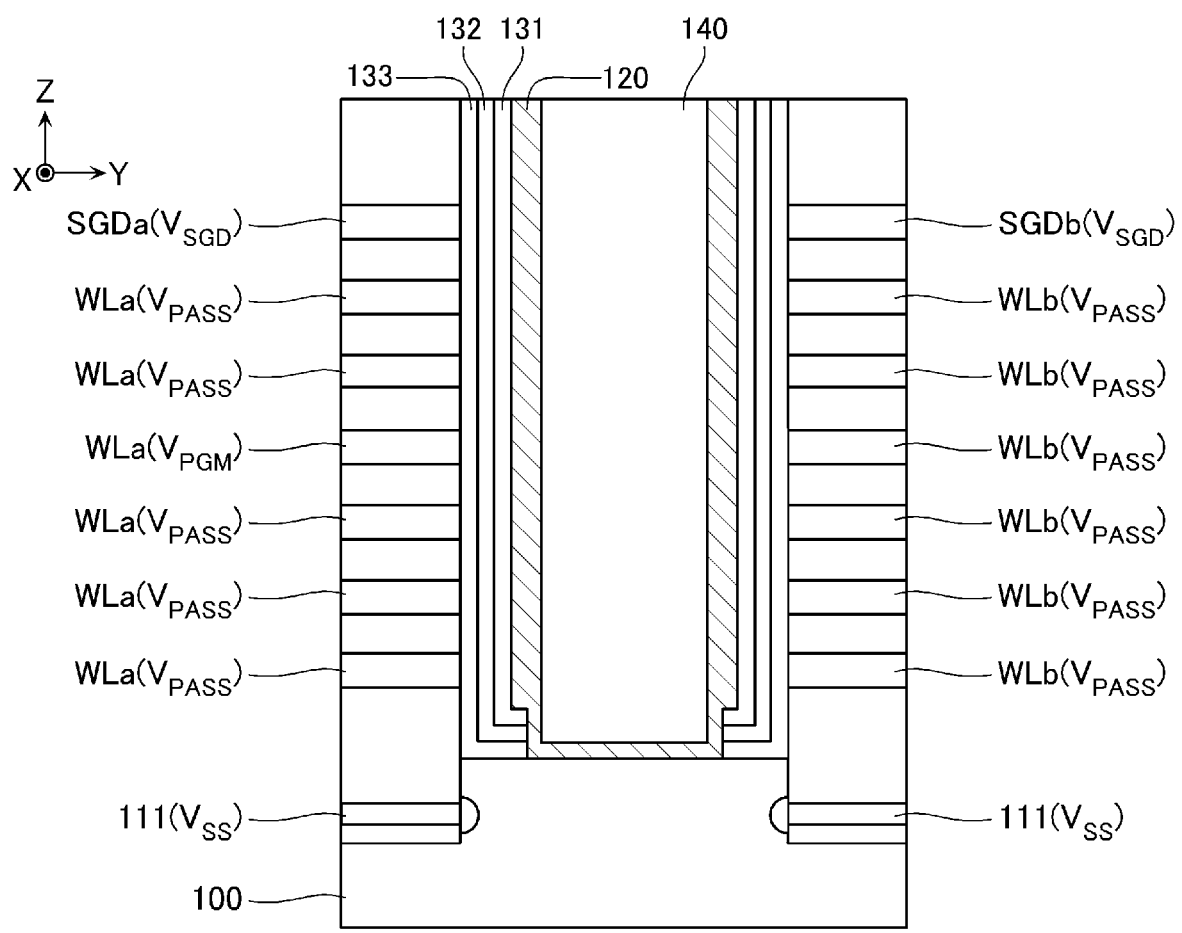
FIG. 9 is a schematic cross-sectional view of a semiconductor storage device for illustrating a program operation according to a first embodiment.
Figure 10:
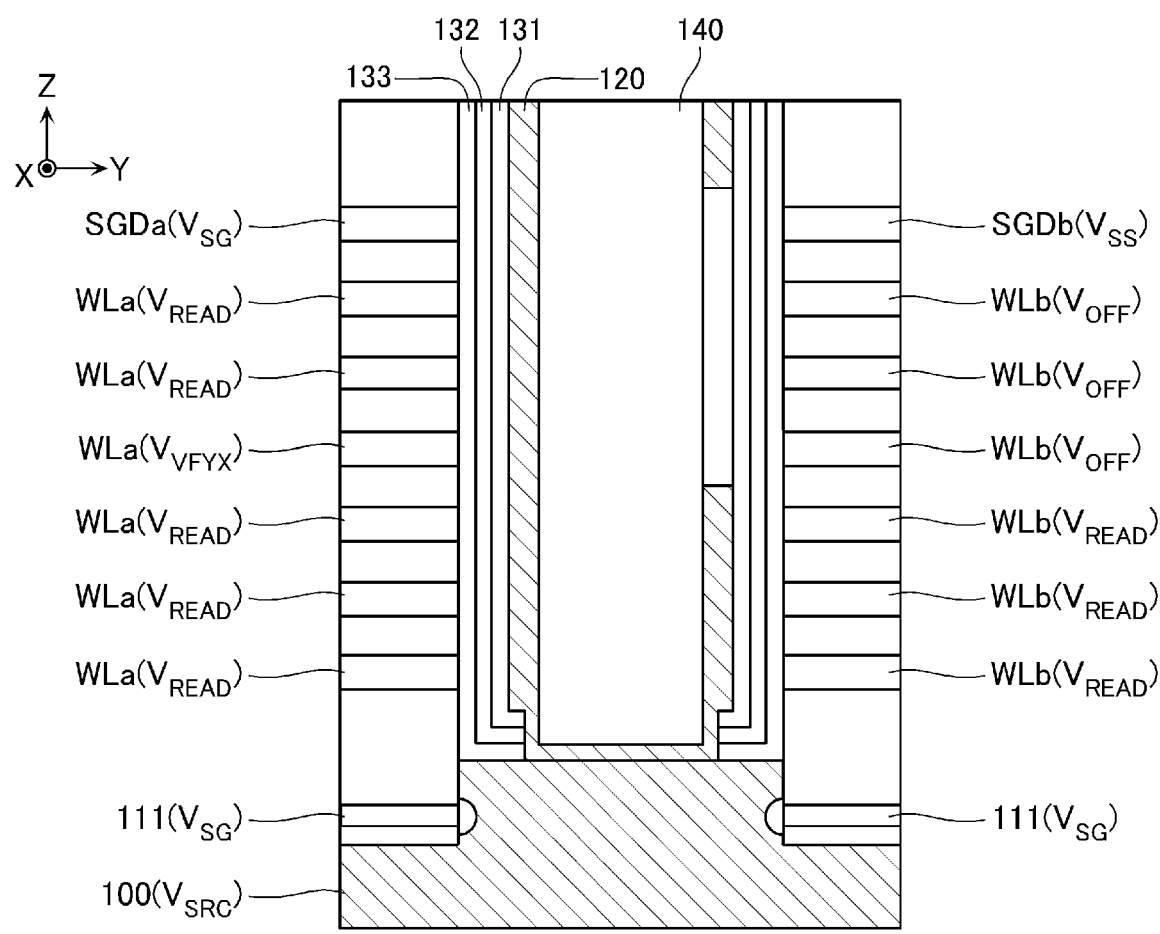
FIG. 10 is a schematic cross-sectional view of a semiconductor storage device for illustrating a verification operation according to a first embodiment.

Next, a write operation of the semiconductor storage device according to this embodiment is described with reference to FIGS. 8 to 10. FIG. 8 is a flowchart of a write operation. FIG. 9 is a schematic cross-sectional view of the semiconductor storage device for illustrating a program operation. FIG. 10 is a schematic cross-sectional view of the semiconductor storage device for illustrating a verification operation. Write operations according to this embodiment are executed collectively on the memory cells MC in a designated page section. FIGS. 9 and 10 illustrate an example of executing a write operation on the page section corresponding to a memory string MSa.

In step S101 (FIG. 8), a loop count nw is set to 1. The loop count nw is recorded in a register or the like.

In step S102, a program operation is executed.

In a program operation, for example, the source voltage $V_{SRC}$ is applied to the bit line BL (FIG. 2) connected to a plurality of selected memory cells MC of which the threshold voltage is adjusted, and a voltage $V_{DD}$ is applied to the bit line BL connected to the selected memory cells MC of which the threshold voltage is not adjusted.

As shown in FIG. 9, a program voltage $V_{PGM}$ is applied to a selected word line WLa, a write path voltage $V_{PASS}$ is applied to non-selected word lines WLa, WLb, a voltage $V_{SGD}$ is applied to drain-side select gate lines SGDa, SGDb, and a ground voltage $V_{SS}$ is applied to a source-side select gate line SGS.

A program voltage $V_{PGM}$ is such a voltage that electrons are accumulated in the charge storage layer 132 of the selected memory cell MC, and is larger than the read path voltage $V_{READ}$. The write path voltage $V_{PASS}$ is such a voltage that the memory cell MC is turned on regardless of the data recorded in the memory cell MC, is the same as or larger than the read path voltage $V_{READ}$, and is smaller than the program voltage $V_{PGM}$. The voltage $V_{SGD}$ is such a voltage that when the source voltage $V_{SRC}$ is applied to the bit line BL, the drain-side select transistor STD is turned on, and when a predetermined drive voltage is applied to the bit line BL, the drain-side select transistor STD is turned off. The voltage $V_{SGD}$ is larger than the ground voltage $V_{SS}$ and smaller than the voltage $V_{SG}$.

Consequently, an electron channel for conducting the bit line BL and the channel region of the selected memory cell MC is formed in the semiconductor layer 120. Electrons in the channel region of the selected memory cell MC are accumulated in the charge storage layer 132 by tunneling the tunnel insulation layer 131.

In step S103 (FIG. 8), a verification operation is executed.

As shown in FIG. 10, a verification operation is basically executed in the same way as a read operation.

It is noted that, in a verification operation, a verification voltage $V_{VFYX}$ (e.g., a verification voltage $V_{VFYA}$, $V_{VFYB}$, or another verification voltage in FIG. 6) is applied to the selected word line WLa instead of the read voltage $V_{CGXR}$.

In a verification operation, the read cutoff voltage $V_{OFF}$ is applied to the adjacent word line WLb and the rear surface drain-side word line WLb, and the read path voltage $V_{READ}$ is applied to the rear surface source-side word line WLb.

In step S104 (FIG. 8), the result of a verification operation is determined. For example, if the ratio of memory cells MC detected as ON state in the verification operation is a certain value or more, a verification FAIL is determined, and the verification operation advances to step S105. On the other hand, if the ratio of memory cells MC detected as ON state in the verification operation is less than the certain value, a verification PASS is determined, and the verification operation advances to step S107.

In step S105, it is determined whether the loop count nw reaches a predetermined count $N_W$. If not reached, the verification operation advances to step S106. If reached the level, the verification operation proceeds to step S108.

In step S106, 1 is added to the loop count nw to advance to step S102. In step S106, for example, a predetermined voltage ΔV is added to the program voltage $V_{PGM}$. For example, the output voltage of the voltage generating unit vg (FIG. 3) for outputting the program voltage $V_{PGM}$ is increased by the voltage ΔV.

In step S107, status data indicating that a write operation is normally finished is stored in a status register, and the write operation is finished.

In step S108, status data indicating that a write operation is not normally finished is stored in the status register, and the write operation is finished.

Page Section as Write Operation Target

In the semiconductor storage device according to this embodiment, erasing operations are executed collectively on all memory cells MC in the memory block BLK. Consequently, all memory cells MC provided in the memory block BLK immediately after the erasing operation are controlled to Er state described with reference to FIG. 6. Hereafter, such a memory block BLK is sometimes referred to as an erased block.

For example, write operations are executed on the erased block sequentially from a page section provided below. For example, in the example shown in FIG. 10, a page section where a write operation is executed first after an erasing operation is executed is the page section corresponding to a first conductive layer 110a counted from below. A page section to which a write operation is executed next is the page section corresponding to the first conductive layer 110b counted from below. Hereafter, write operations are executed sequentially on the page sections corresponding to the conductive layers 110a and 110b provided below. Hereafter, the memory block BLK in which a write operation is executed on a part of the page section is sometimes referred to as an input block. The memory block BLK in which a write operation is executed on all page sections is sometimes referred to as an active block.

COMPARATIVE EXAMPLE

Figure 11:
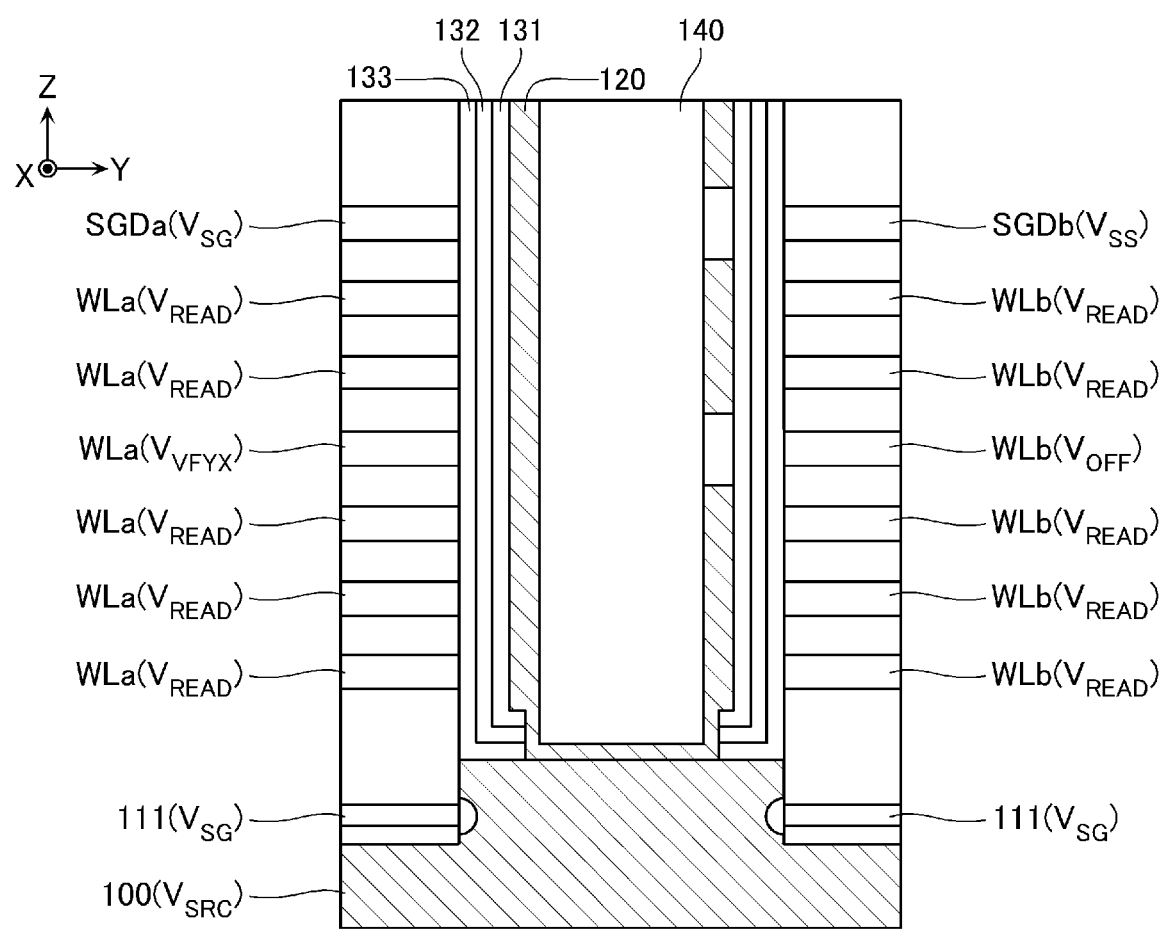
FIG. 11 is a schematic cross-sectional view of a semiconductor storage device for illustrating a verification operation according to a comparative example.

Next, a verification operation according to a comparative example is described with reference to FIG. 11. FIG. 11 is a schematic cross-sectional view illustrating the verification operation according to the comparative example.

In the verification operation according to the comparative example, the read cutoff voltage $V_{OFF}$ is applied to the adjacent word line WLb, and the read path voltage $V_{READ}$ is applied to the other non-selected word lines WLb as shown in FIG. 11.

Data is already written in the page sections corresponding to the front surface source-side word line WLa and the rear surface source-side word line WLb. Accordingly, the memory cell MC provided in these page sections is controlled to Er state, A state, B state or other state as described with reference to FIG. 6.

Data is not written in the page sections corresponding to the front surface drain-side word line WLa and the rear surface drain-side word line WLb. Accordingly, all the memory cells MC provided in these page sections are controlled to Er state described with reference to FIG. 6.

Here, for example, when executing a read operation on the active block, the write operation is executed on all page sections corresponding to the front surface drain-side word line WLa and the rear surface drain-side word line WLb. Accordingly, the threshold voltage of the memory cell MC provided in these page sections is relatively large, and the current flowing in the bit line BL in a read operation may be smaller than the current flowing in the bit line BL in a verification operation. Consequently, the threshold voltage of the memory cells MC corresponding to the selected word lines WLa and WLb cannot be appropriately determined, and there is a risk that erroneous reading may occur.

Effects

In a verification operation according to the first embodiment, the read cutoff voltage $V_{OFF}$ is applied to the rear surface drain-side word line WLb as described with reference to FIG. 10. Consequently, erroneous reading can be reduced by bringing the magnitude of the current flowing in the bit line BL in the verification operation and the current flowing in the bit line BL in the read operation closer.

As described with reference to FIG. 3, in a write operation, the voltage generating units vg provided in the voltage generating circuit VG generate and output voltages having a predetermined voltage value. In the verification operation according to the first embodiment, the read cutoff voltage $V_{OFF}$ applied to the rear surface drain-side word line WLb is equal to the voltage applied to the adjacent word line WLb. Accordingly, the verification operation according to the first embodiment can be realized without increasing the number of voltages applied at one time and without increasing the circuit area of the voltage generating circuit VG.

Second Embodiment

Figure 12:
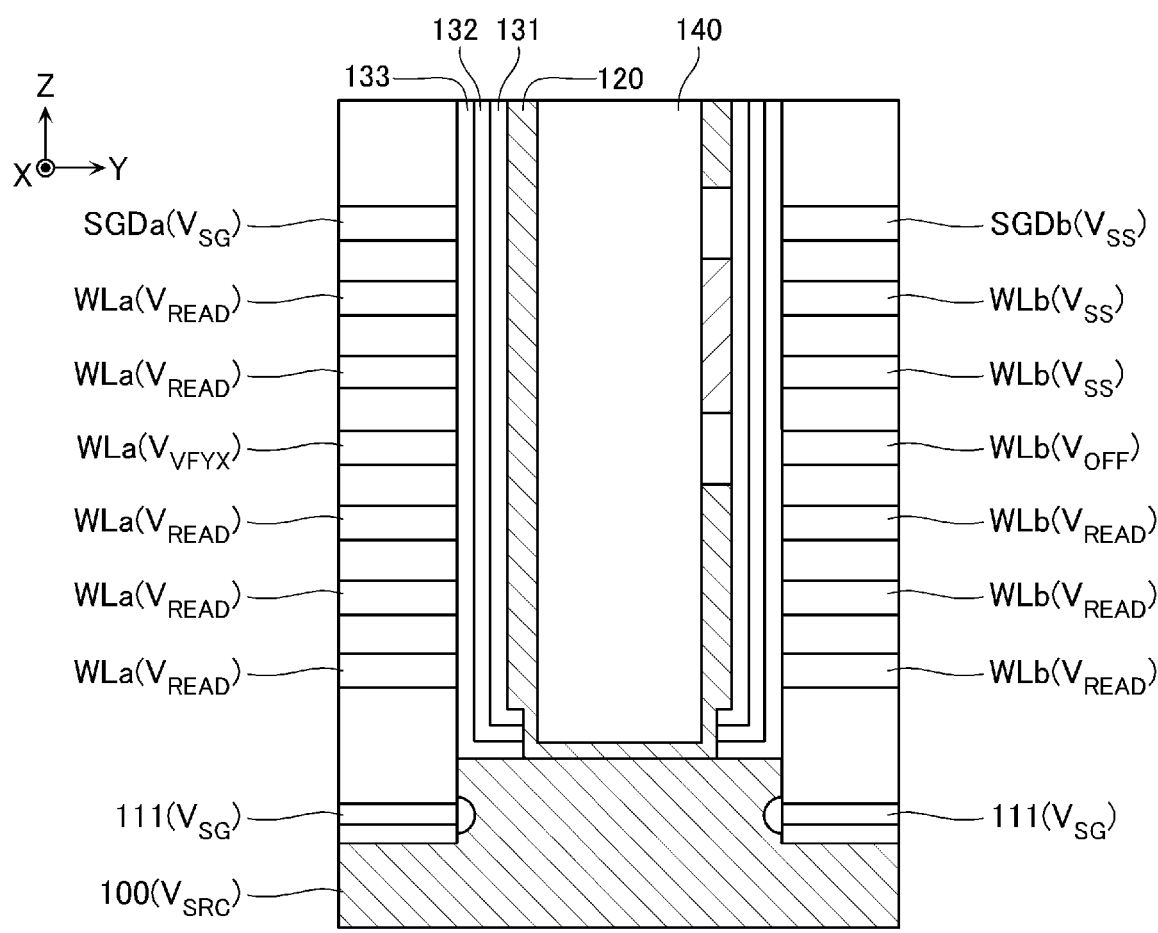
FIG. 12 is a schematic cross-sectional view of a semiconductor storage device for illustrating a verification operation according to a second embodiment.

Next, a verification operation according to a second embodiment is described with reference to FIG. 12. FIG. 12 is a schematic cross-sectional view illustrating the verification operation according to the second embodiment.

As described with reference to FIG. 10, in the verification operation according to the first embodiment, the read cutoff voltage $V_{OFF}$ is applied to the rear surface drain-side word line WLb. However, this method is a mere example. A voltage applied to the rear surface drain-side word line WLb may be a voltage smaller than the read path voltage $V_{READ}$.

For example, in the verification operation according to the second embodiment, the ground voltage $V_{SS}$ is applied to the rear surface drain-side word line WLb instead of the read cutoff voltage $V_{OFF}$, as shown in FIG. 12.

By such a method, the current flowing in the bit line BL in the verification operation can be reduced. Since the ground voltage $V_{SS}$ can be applied via the bonding pad electrode P described with reference to FIG. 3, the ground voltage $V_{SS}$ can be utilized without increasing the circuit area of the voltage generating circuit VG.

Third Embodiment

Figure 13:
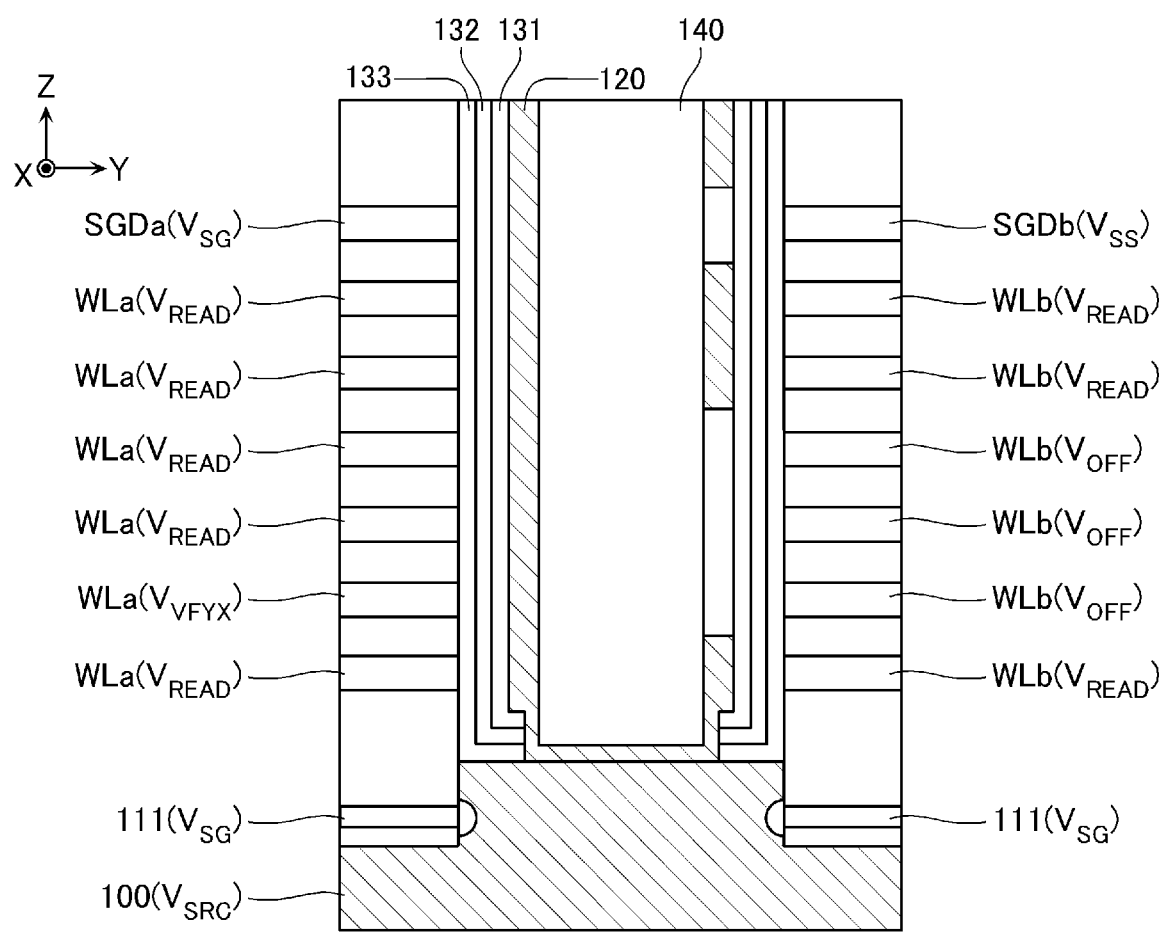
FIGS. 13 and 14 are schematic cross-sectional views of a semiconductor storage device for illustrating a verification operation according to a third embodiment.
Figure 14:
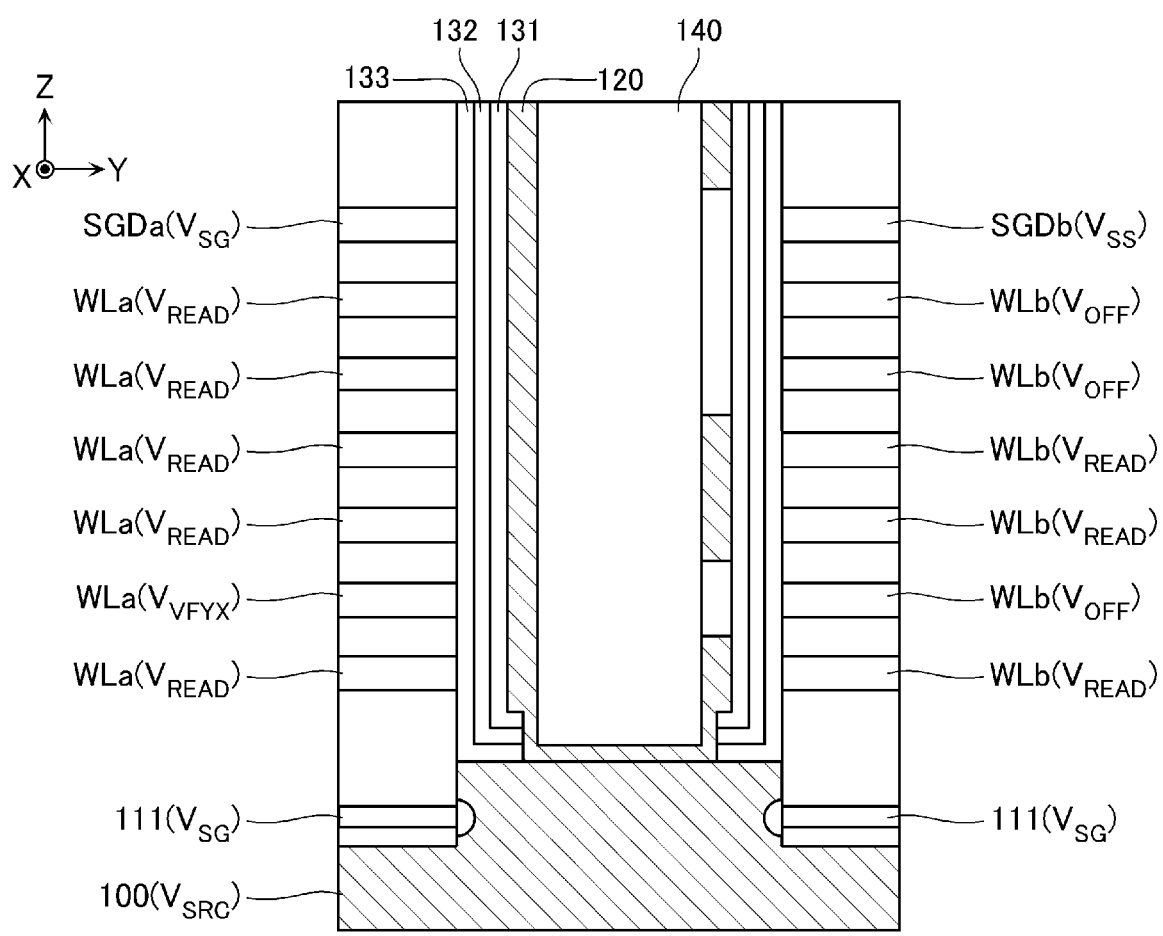

Next, a verification operation according to a third embodiment is described with reference to FIGS. 13 and 14. FIGS. 13 and 14 are schematic cross-sectional views illustrating the verification operation according to the third embodiment.

As described with reference to FIGS. 10 and 12, in the verification operation of the first and second embodiments, a voltage lower than the read path voltage $V_{READ}$ (for example, read cutoff voltage $V_{OFF}$ or ground voltage $V_{SS}$) is applied to all rear surface drain-side word lines WLb. However, this method is a mere example. For example, the read path voltage $V_{READ}$ may be applied to a part of the rear surface drain-side word line WLb, and a voltage lower than the read path voltage $V_{READ}$ may be applied to a part of the rear surface drain-side word line WLb.

For example, as shown in FIG. 13, in the verification operation according to the third embodiment, among a plurality of rear surface drain-side word lines WLb, the read path voltage $V_{READ}$ is applied to the rear surface drain-side word lines WLb provided above a certain height position, and a voltage lower than the read path voltage $V_{READ}$ (read cutoff voltage $V_{OFF}$ in the example of FIG. 13) is applied to the other rear surface drain-side word lines WLb provided below the certain height position.

For example, in the verification operation according to the first or second embodiment, when the current of the bit line BL becomes too small, the current of the bit line BL may be adjusted by adjusting the value of the voltage applied to the rear surface drain-side word line WLb. However, if such a method is adopted, the number of voltage values applied at one time may increase and the circuit area of the voltage generating circuit VG may increase. In the verification operation according to the third embodiment, the current of the bit line BL can be adjusted by simply utilizing the voltage applied to the other wiring. Accordingly, the method can be realized without increasing the circuit area of the voltage generating circuit VG.

The method shown in FIG. 13 is a mere example and may be adjusted appropriately.

For example, as shown in FIG. 14, in the verification operation according to the third embodiment, among the rear surface drain-side word lines WLb, the read path voltage $V_{READ}$ may be applied to the rear surface drain-side word lines WLb provided below a certain height position, and a voltage lower than the read path voltage $V_{READ}$ (read cutoff voltage $V_{OFF}$ in the example in FIG. 14) may be applied to the other rear surface drain-side word lines WLb provided above the certain height position.

In the examples in FIGS. 13 and 14, another voltage (for example, ground voltage $V_{SS}$) may be applied to the conductive layers 110b to which the read cutoff voltage $V_{OFF}$ is applied instead of the read cutoff voltage $V_{OFF}$.

Fourth Embodiment

Figure 15:
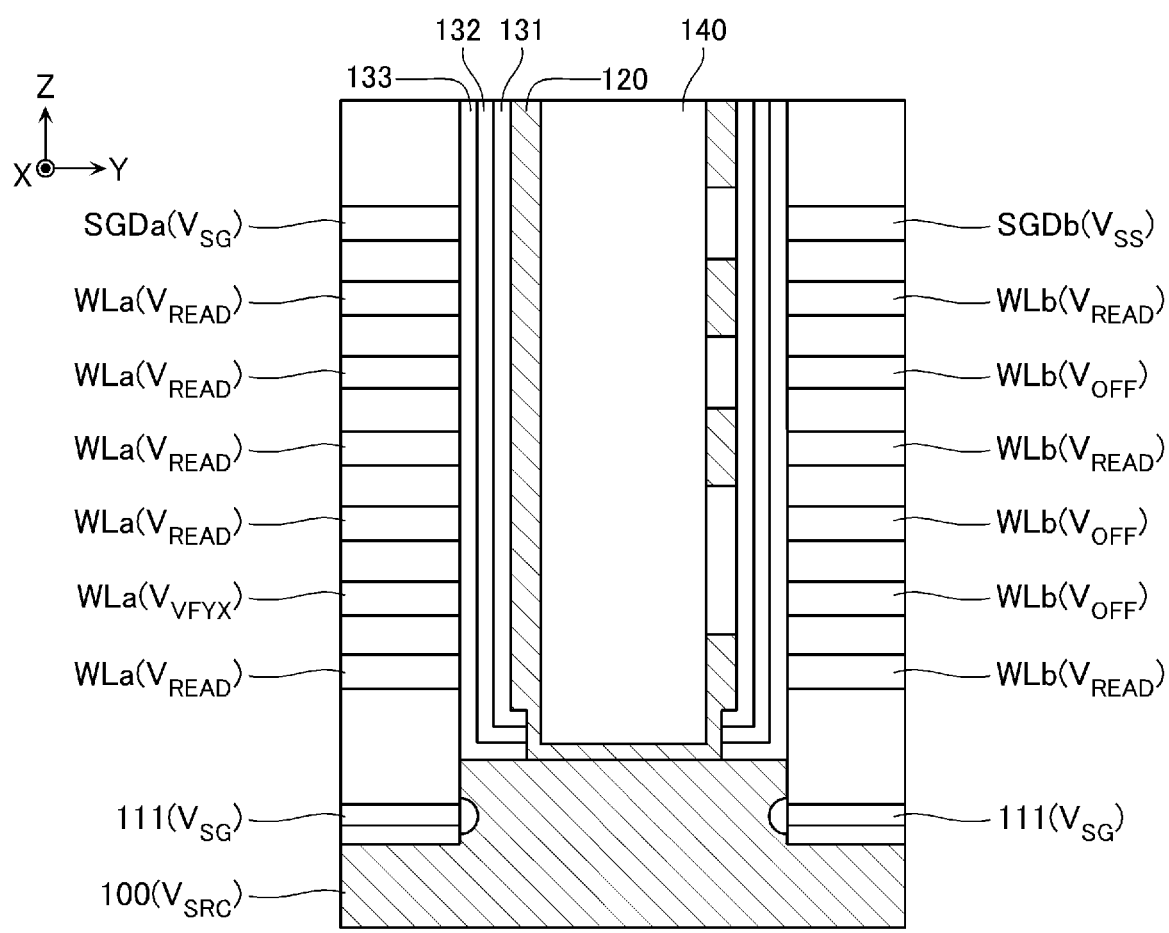
FIG. 15 is a schematic cross-sectional view of a semiconductor storage device for illustrating a verification operation according to a fourth embodiment.

Next, a verification operation according to a fourth embodiment is described with reference to FIG. 15. FIG. 15 is a schematic cross-sectional view illustrating the verification operation according to the fourth embodiment.

As described with reference to FIGS. 13 and 14, in the verification operation according to the third embodiment, the read path voltage $V_{READ}$ is applied to one of the rear surface drain-side word lines WLb provided above a certain height position and below the certain height position, and a voltage lower than the read path voltage $V_{READ}$ (for example, read cutoff voltage $V_{OFF}$ or ground voltage $V_{SS}$) is applied to the other rear surface drain-side word lines WLb. However, this method is a mere example.

For example, as shown in FIG. 15, in the verification operation according to the fourth embodiment, among the rear surface drain-side word lines WLb, the read path voltage $V_{READ}$ is applied to one of even-numbered rear surface drain-side word lines WLb counted from below and odd-numbered rear surface drain-side word lines WLb counted from below, and a voltage lower than the read path voltage $V_{READ}$ (for example, read cutoff voltage $V_{OFF}$ or ground voltage $V_{SS}$) is applied to the other rear surface drain-side word lines WLb.

Fifth Embodiment

Figure 16:
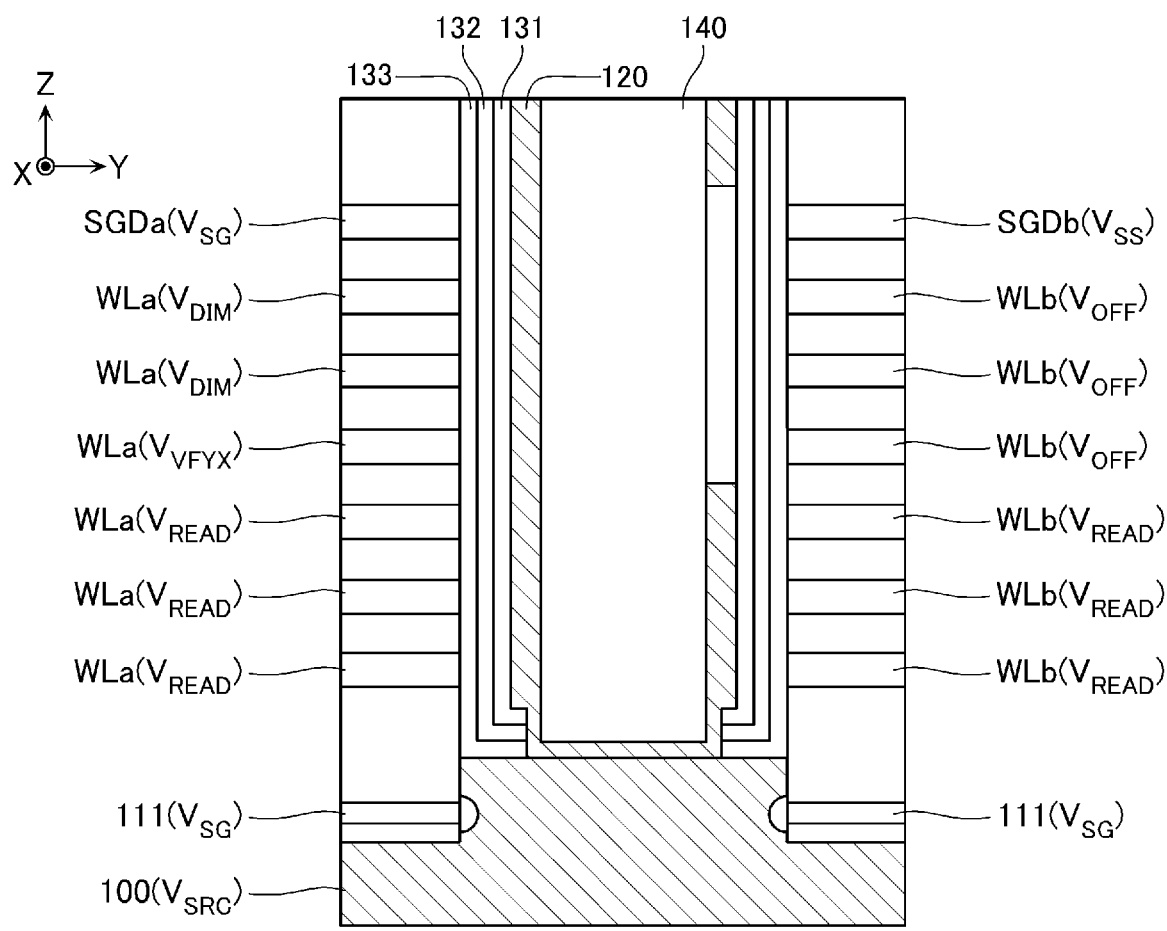
FIG. 16 is a schematic cross-sectional view of a semiconductor storage device for illustrating a verification operation according to a fifth embodiment.

Next, a verification operation according to a fifth embodiment is described with reference to FIG. 16. FIG. 16 is a schematic cross-sectional view illustrating the verification operation according to the fifth embodiment.

As described with reference to FIGS. 10 and 12 to 15, in the verification operation according to the first to fourth embodiments, the read path voltage $V_{READ}$ is applied to the front surface drain-side word lines WLa. However, this method is a mere example.

For example, in the verification operation according to the fifth embodiment, a voltage $V_{DIM}$ is applied to the front surface drain-side word line WLa as shown in FIG. 16. The voltage $V_{DIM}$ is larger than the ground voltage $V_{SS}$ described with reference to FIG. 6 and smaller than the read path voltage $V_{READ}$.

For example, the verification operation according to the fifth embodiment may be used when the current of the bit line BL cannot be sufficiently reduced in the verification operation according to the first embodiment or the second embodiment.

FIG. 16 shows an example of applying a voltage similar to that of the verification operation according to the first embodiment to the rear surface drain-side word line WLb. However, in the verification operation according to the fifth embodiment, a voltage similar to that of the verification operation according to any of the second to fourth embodiments may be applied to the rear surface drain-side word lines WLb.

FIG. 16 shows an example of applying the voltage $V_{DIM}$ to all front surface drain-side word lines WLa. However, in the verification operation according to the fifth embodiment, the voltage $V_{DIM}$ may be applied to a part of the front surface drain-side word lines WLa and the read path voltage $V_{READ}$ may be applied to the other front surface drain-side word lines WLa.

Sixth Embodiment

Next, a verification operation according to a sixth embodiment is described with reference to FIG. 17. FIG. 17 is a schematic cross-sectional view illustrating the verification operation according to the sixth embodiment.

As described with reference to FIGS. 10 and 12 to 16, in the verification operation according to the first to fifth embodiments, the voltage applied to at least a part of the rear surface drain-side word lines WLb is made smaller than the voltage applied to the front surface drain-side word lines. However, this method is a mere example.

For example, in the verification operation according to the sixth embodiment, the voltage applied to at least a part of the front surface drain-side word lines WLa is made smaller than the voltage applied to the rear surface drain-side word lines, as shown in FIG. 17. Specifically, a voltage lower than the read path voltage $V_{READ}$ (for example, read cutoff voltage $V_{OFF}$ or ground voltage $V_{SS}$) is applied to the front surface drain-side word lines. The read path voltage $V_{READ}$ is applied to the rear surface drain-side word line.

In the semiconductor storage device according to the first to fifth embodiments, one memory block BLK includes both the word lines WLa and the word lines WLb. However, one memory block BLK may include either the word lines WLa or the word lines WLb. In other words, the word lines WLa and the word lines WLb may be provided in different memory blocks BLK.

In such a case, for example, the memory block BLK including the conductive layer 110a is the input block, and the memory block BLK including the conductive layer 110b is the active block. In such a case, even when executing a write operation on the page section corresponding to the conductive layer 110a, if a current flows through the memory cell MC corresponding to the rear surface drain-side word line WLb, the current of the bit line BL in a verification operation and the current of the bit line BL in a read operation can be brought closer.

FIG. 17 shows an example of applying a voltage similar to the voltage applied to the rear surface drain-side word line WLb in the verification operation according to the first embodiment to the front surface drain-side word line WLa. However, in the verification operation according to the sixth embodiment, a voltage similar to the voltage applied to the rear surface drain-side word line WLb in verification operation according to any of the second to fifth embodiments may be applied to the front surface drain-side word line WLa.

FIG. 17 shows an example of applying the read path voltage $V_{READ}$ to the rear surface drain-side word line WLb. However, in the verification operation according to the sixth embodiment, the voltage $V_{DIM}$ may be applied to the rear surface drain-side word line WLb. The voltage $V_{DIM}$ may be applied to a part of the rear surface drain-side word lines WLb, and the read path voltage $V_{READ}$ may be applied to the other rear surface drain-side word lines WLb.

OTHER EMBODIMENTS

The semiconductor storage device according to the first embodiment to the sixth embodiment is exemplified above. However, the above aspects are mere examples, and may be adjusted appropriately.

For example, in the semiconductor storage device according to the first to sixth embodiments, write operations are executed sequentially from the page section provided below. However, such a method is merely an example. For example, write operations may be executed sequentially from the page section provided above.

Here, when write operations are executed sequentially from the page section provided below, in the write operation, the memory cell MC provided in the page section corresponding to the front surface source-side word lines WLa and the rear surface source-side word lines WLb is controlled to Er state, A state, B state or other state. All memory cells MC provided in the page section corresponding to the front surface drain-side word line WLa and the rear surface drain-side word line WLb are in Er state. Accordingly, by lowering at least one voltage of the front surface drain-side word line WLa and the rear surface drain-side word line WLb in the verification operation, the magnitudes of a current flowing in the bit line BL in the verification operation and a current flowing in the bit line BL in the read operation can be brought closer.

If write operations are executed sequentially from the page section provided above, the memory cell MC provided in the page sections corresponding to the front surface drain-side word line WLa and the rear surface drain-side word line WLb is controlled to Er state, A state, B state or other state in the write operation. All memory cells MC provided in the page section corresponding to the front surface source-side word line WLa and the rear surface source-side word line WLb are in Er state. Accordingly, by lowering at least one voltage of the front surface source-side word line WLa and the rear surface source-side word line WLb in the verification operation, the magnitudes of a current flowing in the bit line BL in the verification operation and a current flowing in the bit line BL in the read operation can be brought closer.

Accordingly, when write operations are executed sequentially from the page section provided above, the voltage applied to the front surface drain-side word lines WLa and the rear surface drain-side word lines WLb in the verification operation according to the first to sixth embodiments can be applied to the front surface source-side word lines WLa and the rear surface source-side word lines WLb. The voltage applied to the front surface source-side word lines WLa and the rear surface source-side word lines WLb in the verification operation according to the first to sixth embodiments can be applied to the front surface drain-side word lines WLa and the rear surface drain-side word lines WLb.
Other While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a voltage generation circuit;
   a first plurality of conductive layers arranged along a first direction, extending along a second direction crossing the first direction, and including first, second, and third conductive layers, the first conductive layer being between the second and third conductive layers;
   a second plurality of conductive layers arranged along the first direction, extending along the second direction, including fourth, fifth, and sixth conductive layers at positions corresponding to the first through third conductive layers and separated therefrom in the second direction;
   a first semiconductor layer extending along the first direction between the first and second pluralities; and
   a charge storage layer extending along the first direction and including a first portion between the first semiconductor layer and the first plurality and a second portion between the first semiconductor layer and the second plurality, wherein
   the voltage generation circuit is configured to, in a first verification operation of a first write operation in which a program voltage has been applied to the first conductive layer, apply:
   a verification voltage to the first conductive layer,
   a first voltage smaller than the verification voltage to the fourth conductive layer,
   a read path voltage larger than the verification voltage to the second and fifth conductive layers, and
   a second voltage smaller than the read path voltage to the third conductive layer or the sixth conductive layer.

2. The semiconductor storage device according to claim 1, wherein the voltage generation circuit applies the second voltage to the sixth conductive layer.

3. The semiconductor storage device according to claim 2, wherein the voltage generation circuit is further configured to apply the read path voltage to the third conductive layer in the first verification operation.

4. The semiconductor storage device according to claim 2, wherein the voltage generation circuit is further configured to apply a third voltage smaller than the read path voltage and larger than the second voltage to the third conductive layer in the first verification operation.

5. The semiconductor storage device according to claim 1, wherein the voltage generation circuit applies the second voltage to the third conductive layer.

6. The semiconductor storage device according to claim 5, wherein the voltage generation circuit is further configured to apply the read path voltage to the sixth conductive layer in the first verification operation.

7. The semiconductor storage device according to claim 5, wherein the voltage generation circuit is further configured to apply a third voltage smaller than the read path voltage and larger than the second voltage to the sixth conductive layer in the first verification operation.

8. The semiconductor storage device according to claim 1, wherein the first and second voltages have a same voltage value.

9. The semiconductor storage device according to claim 1, wherein the second voltage is a ground voltage.

10. The semiconductor storage device according to claim 1, wherein the second plurality further includes a seventh conductive layer, the fourth conductive layer is between the fifth and seventh conductive layers, and the voltage generation circuit is further configured to apply the read path voltage to the seventh conductive layer in the first verification operation.

11. The semiconductor storage device according to claim 10, wherein the seventh conductive layer is between the fourth and sixth conductive layers.

12. The semiconductor storage device according to claim 11, wherein the second plurality further includes an eighth conductive layer between the seventh and fourth conductive layers, and the voltage generation circuit is further configured to apply the read path voltage to the eighth conductive layer in the first verification operation.

13. The semiconductor storage device according to claim 11, wherein the second plurality further includes an eighth conductive layer between the seventh and fourth conductive layers, and the voltage generation circuit is further configured to apply the second voltage to the eighth conductive layer in the first verification operation.

14. The semiconductor storage device according to claim 10, wherein the sixth conductive layer is between the fourth and seventh conductive layers.

15. The semiconductor storage device according to claim 14, wherein the second plurality further includes a ninth conductive layer between the sixth and fourth conductive layers, and the voltage generation circuit is further configured to apply the second voltage to the ninth conductive layer in the first verification operation.

16. The semiconductor storage device according to claim 1, wherein the voltage generation circuit is further configured to apply, in a first read operation after the first write operation:

a read voltage larger than the first voltage and smaller than the read path voltage to the first conductive layer, the first voltage to the fourth conductive layer, and the read path voltage to the second, third, fifth, and sixth conductive layers.

17. The semiconductor storage device according to claim 1, wherein the voltage generation circuit is further configured to apply the program voltage to the second conductive layer in a second write operation and the third conductive layer in a third write operation, and the first write operation is executable after the second write operation and before the third write operation between two erasing operations with respect to the first through third conductive layers.

18. A method of a semiconductor storage device that includes:

a first plurality of conductive layers arranged along a first direction, extending along a second direction crossing the first direction, and including first, second, and third conductive layers, the first conductive layer being between the second and third conductive layers, a second plurality of conductive layers arranged along the first direction, extending along the second direction, including fourth, fifth, and sixth conductive layers at positions corresponding to the first through third conductive layers and separated therefrom in the second direction, a first semiconductor layer extending along the first direction between the first and second pluralities, and a charge storage layer extending along the first direction and including a first portion between the first semiconductor layer and the first plurality and a second portion between the first semiconductor layer and the second plurality, the method comprising:

in a first verification operation of a first write operation in which a program voltage has been applied to the first conductive layer, applying:

a verification voltage to the first conductive layer, a first voltage smaller than the verification voltage to the fourth conductive layer, a read path voltage larger than the verification voltage to the second and fifth conductive layers, and a second voltage smaller than the read path voltage to the third conductive layer or the sixth conductive layer.

19. The method according to claim 18, wherein the second voltage is applied to the sixth conductive layer.

20. The method according to claim 19, wherein the read path voltage is applied to the third conductive layer in the first verification operation.

* * * * *